United States Patent
Jang et al.

(10) Patent No.: US 12,333,148 B2
(45) Date of Patent: Jun. 17, 2025

(54) SEMICONDUCTOR MEMORY DEVICES THAT PERFORM BURST OPERATIONS

(71) Applicant: Samsung Electronics Co., Ltd., Suwon-si (KR)

(72) Inventors: Jinhoon Jang, Suwon-si (KR); Kyungryun Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 174 days.

(21) Appl. No.: 17/938,651

(22) Filed: Oct. 6, 2022

(65) Prior Publication Data

US 2023/0124660 A1 Apr. 20, 2023

(30) Foreign Application Priority Data

Oct. 20, 2021 (KR) .................. 10-2021-0140424
Mar. 31, 2022 (KR) .................. 10-2022-0040041

(51) Int. Cl.
*G11C 8/00* (2006.01)
*G06F 3/06* (2006.01)

(52) U.S. Cl.
CPC .......... *G06F 3/0613* (2013.01); *G06F 3/0659* (2013.01); *G06F 3/0673* (2013.01)

(58) Field of Classification Search
CPC .................................................. G11C 7/1018
USPC .................................................. 365/233.18
See application file for complete search history.

(56) References Cited

U.S. PATENT DOCUMENTS

| | | | |
|---|---|---|---|
| 5,634,105 A | 5/1997 | Mizuno | |
| 7,050,340 B1 | 5/2006 | Ruckerbauer et al. | |
| 8,023,358 B2 | 9/2011 | Kim et al. | |
| 8,432,769 B2 | 4/2013 | Moon | |
| 8,458,572 B1 * | 6/2013 | Vlaiko | G06F 11/1048 360/48 |
| 9,412,435 B2 | 8/2016 | Hirobe | |
| 9,424,902 B2 | 8/2016 | Chen et al. | |
| 10,606,692 B2 | 3/2020 | Coteus et al. | |
| 2013/0254625 A1 | 9/2013 | Vlaiko | |
| 2015/0198966 A1 * | 7/2015 | Lee | G06F 1/324 713/501 |
| 2019/0188074 A1 | 6/2019 | Coteus et al. | |
| 2021/0019225 A1 | 1/2021 | Oh et al. | |
| 2021/0208966 A1 * | 7/2021 | Shim | G11C 29/26 |
| 2021/0405927 A1 | 12/2021 | Oh et al. | |

OTHER PUBLICATIONS

Extended European Search Report Corresponding to European Application No. 22196376.2 (9 pages) (Feb. 28, 2023).

* cited by examiner

*Primary Examiner* — Hoai V Ho
(74) *Attorney, Agent, or Firm* — Myers Bigel, P.A.

(57) ABSTRACT

A semiconductor memory device includes a memory cell array and a plurality of data input/output (I/O) pins. The plurality of data I/O pins is configured to receive write data to be stored in the memory cell array or to output read data stored in the memory cell array. The semiconductor memory device is configured to perform a burst operation in which a single data set comprising a plurality of data bits is input or output through the plurality of data I/O pins based on a single command received from an external memory controller. A number of the plurality of data I/O pins corresponds to an integer that is not a power-of-two. A burst length representing a unit of the burst operation corresponds to an integer that is not a power-of-two.

20 Claims, 23 Drawing Sheets

FIG. 8

| WCK | 0 | | 1 | | | 2 | | | 3 | | | 4 | | | 5 | | |
|---|---|---|---|---|---|---|---|---|---|---|---|---|---|---|---|---|---|
| DQ0 | BL 0 | BL 1 | BL 2 | BL 3 | BL 4 | BL 5 | BL 6 | BL 7 | BL 8 | BL 9 | BL 10 | BL 11 | BL 12 | BL 13 | BL 14 | BL 15 | BL 16 | BL 17 | BL 18 | BL 19 | BL 20 | BL 21 | BL 22 | BL 23 |
| DQ1 | BL 0 | BL 1 | BL 2 | BL 3 | BL 4 | BL 5 | BL 6 | BL 7 | BL 8 | BL 9 | BL 10 | BL 11 | BL 12 | BL 13 | BL 14 | BL 15 | BL 16 | BL 17 | BL 18 | BL 19 | BL 20 | BL 21 | BL 22 | BL 23 |
| DQ2 | BL 0 | BL 1 | BL 2 | BL 3 | BL 4 | BL 5 | BL 6 | BL 7 | BL 8 | BL 9 | BL 10 | BL 11 | BL 12 | BL 13 | BL 14 | BL 15 | BL 16 | BL 17 | BL 18 | BL 19 | BL 20 | BL 21 | BL 22 | BL 23 |
| DQ3 | BL 0 | BL 1 | BL 2 | BL 3 | BL 4 | BL 5 | BL 6 | BL 7 | BL 8 | BL 9 | BL 10 | BL 11 | BL 12 | BL 13 | BL 14 | BL 15 | BL 16 | BL 17 | BL 18 | BL 19 | BL 20 | BL 21 | BL 22 | BL 23 |
| DQ4 | BL 0 | BL 1 | BL 2 | BL 3 | BL 4 | BL 5 | BL 6 | BL 7 | BL 8 | BL 9 | BL 10 | BL 11 | BL 12 | BL 13 | BL 14 | BL 15 | BL 16 | BL 17 | BL 18 | BL 19 | BL 20 | BL 21 | BL 22 | BL 23 |
| DQ5 | BL 0 | BL 1 | BL 2 | BL 3 | BL 4 | BL 5 | BL 6 | BL 7 | BL 8 | BL 9 | BL 10 | BL 11 | BL 12 | BL 13 | BL 14 | BL 15 | BL 16 | BL 17 | BL 18 | BL 19 | BL 20 | BL 21 | BL 22 | BL 23 |
| DQ6 | BL 0 | BL 1 | BL 2 | BL 3 | BL 4 | BL 5 | BL 6 | BL 7 | BL 8 | BL 9 | BL 10 | BL 11 | BL 12 | BL 13 | BL 14 | BL 15 | BL 16 | BL 17 | BL 18 | BL 19 | BL 20 | BL 21 | BL 22 | BL 23 |
| DQ7 | BL 0 | BL 1 | BL 2 | BL 3 | BL 4 | BL 5 | BL 6 | BL 7 | BL 8 | BL 9 | BL 10 | BL 11 | BL 12 | BL 13 | BL 14 | BL 15 | BL 16 | BL 17 | BL 18 | BL 19 | BL 20 | BL 21 | BL 22 | BL 23 |
| DQ8 | DBI 0 | DBI 1 | DBI 2 | DBI 3 | DBI 4 | DBI 5 | DBI 6 | DBI 7 | DBI 8 | DBI 9 | DBI 10 | DBI 11 | DBI 12 | DBI 13 | DBI 14 | DBI 15 | DBI 16 | DBI 17 | DBI 18 | DBI 19 | DBI 20 | DBI 21 | DBI 22 | DBI 23 |
| DQ9 | BL 24 | BL 24 | BL 24 | BL 24 | BL 25 | BL 25 | BL 25 | BL 25 | BL 26 | BL 26 | BL 26 | BL 26 | BL 27 | BL 27 | BL 27 | BL 27 | BL 28 | BL 28 | BL 28 | BL 28 | BL 29 | BL 29 | BL 29 | BL 29 | BL 30 | BL 30 | BL 30 | BL 30 | BL 31 | BL 31 | BL 31 | BL 31 |
| DQ10 | BL 24 | BL 24 | BL 24 | BL 24 | BL 25 | BL 25 | BL 25 | BL 25 | BL 26 | BL 26 | BL 26 | BL 26 | BL 27 | BL 27 | BL 27 | BL 27 | BL 28 | BL 28 | BL 28 | BL 28 | BL 29 | BL 29 | BL 29 | BL 29 | BL 30 | BL 30 | BL 30 | BL 30 | BL 31 | BL 31 | BL 31 | BL 31 |
| DQ11 | DBI 24 | BL 24 | DBI 24 | BL 24 | DBI 25 | BL 25 | DBI 25 | BL 25 | DBI 26 | BL 26 | DBI 26 | BL 26 | DBI 27 | BL 27 | DBI 27 | BL 27 | DBI 28 | BL 28 | DBI 28 | BL 28 | DBI 29 | BL 29 | DBI 29 | BL 29 | DBI 30 | BL 30 | DBI 30 | BL 30 | DBI 31 | BL 31 | DBI 31 | BL 31 |

SEMICONDUCTOR MEMORY DEVICES THAT PERFORM BURST OPERATIONS

REFERENCE TO PRIORITY APPLICATION

This application claims priority under 35 USC § 119 to Korean Patent Application No. 10-2021-0140424 filed on Oct. 20, 2021, and to Korean Patent Application No. 10-2022-0040041 filed on Mar. 31, 2022, in the Korean Intellectual Property Office (KIPO), the contents of which are herein incorporated by reference in their entirety.

BACKGROUND

1. Technical Field

Example embodiments relate generally to semiconductor integrated circuits, and more particularly to semiconductor memory devices, and methods of operating the semiconductor memory devices.

2. Description of the Related Art

Semiconductor memory devices may be classified into nonvolatile memory devices such as flash memories and volatile memory devices such as dynamic random access memories (DRAMs). High speed operation and cost efficiency of the volatile memory devices make it possible for the volatile memory devices to be used for system memories.

Recently, the integration degree and capacity of semiconductor memory devices are increasing, and data transfer rates are also increasing. As such, the total number of bits transferred for each memory access may increase, and additional input/output (I/O) pins or lanes and corresponding module/board signal traces and connector pins may be required. However, additional I/O pins may increase overall memory device costs. Therefore, techniques for transmitting more bits without excessively increasing the number of I/O pins have been researched.

SUMMARY

At least one example embodiment of the present disclosure provides a semiconductor memory device capable of improving or enhancing the bandwidth and signal integrity characteristics without excessively increasing costs.

At least one example embodiment of the present disclosure provides a method of operating the semiconductor memory device.

According to example embodiments, a semiconductor memory device comprises a memory cell array and a plurality of data input/output (I/O) pins. The plurality of data I/O pins are configured to receive write data to be stored in the memory cell array or to output read data stored in the memory cell array. The semiconductor memory device is configured to perform a burst operation in which a single data set comprising a plurality of data bits is input or output through the plurality of data I/O pins based on a single command received from an external memory controller. A number of the plurality of data I/O pins corresponds to an integer that is not a power-of-two. A burst length representing a unit of the burst operation corresponds to an integer that is not a power-of-two.

According to example embodiments, a method of operating a semiconductor memory device comprises receiving a write command or a read command. The method comprises performing at least one of: a data write operation in which write data is stored in the memory cell array; or a data read operation in which the read data stored in the memory cell array is retrieved from the memory cell array, wherein the performing is based on the write command or the read command. During the data write operation, the write data is received through a plurality of data input/output (I/O) pins. During the data read operation, the read data output through the plurality of data input/output (I/O) pins. An operation of receiving the write data and/or an operation of outputting the read data is performed based on a burst operation in which a single data set comprising a plurality of data bits is input or output through the plurality of data I/O pins based on a single command received from an external memory controller. A number of the plurality of data I/O pins corresponds to an integer that is not a power-of-two. A burst length representing a unit of the burst operation corresponds to an integer that is not a power-of-two.

According to example embodiments, a semiconductor memory device comprises a memory cell array, a plurality of data input/output (I/O) pins, a data processing path, and a clock divider. The plurality of data I/O pins is configured to receive write data to be stored in the memory cell array or to output read data stored in the memory cell array. The data processing path is between the memory cell array and the plurality of data I/O pins. The clock divider is configured to generate a second command clock signal based on a first command clock signal. A data write operation in which write data is stored in the memory cell array is performed based on a write command, or a data read operation in which the read data stored in the memory cell array is retrieved from the memory cell array is performed based on a read command. An operation of receiving the write data and/or an operation of outputting the read data is performed based on a burst operation in which a single data set comprising a plurality of data bits is input or output through the plurality of data I/O pins based on a single command received from an external memory controller. A number of the plurality of data I/O pins corresponds to an integer that is not a power-of-two. A burst length representing a unit of the burst operation corresponds to an integer that is not a power-of-two and corresponds to an integer that is a multiple-of-three. The plurality of data bits in the single data set comprise first data bits corresponding to the write data or the read data. A number of the first data bits corresponds to an integer that is a power-of-two. The memory cell array, the data processing path, and the plurality of data I/O pins are configured to operate based on a data clock signal and the second command clock signal. A division ratio of the clock divider corresponds to an integer that is not a power-of-two and corresponds to an integer that is a multiple-of-three. A division ratio of the clock divider corresponds to an integer that is not a power-of-two and corresponds to an integer that is a multiple-of-three In the semiconductor memory device and the method of operating the semiconductor memory device according to example embodiments, both the burst length and the number of data I/O pins may be implemented to correspond to an integer that is not a power-of-two. Even if both the burst length and the number of data I/O pins correspond to an integer that is not a power-of-two, the actual data to be written or read may be implemented to include a number of pieces of information (e.g., data bits) corresponding to an integer that is a power-of-two. In addition, the additional data required for writing or reading the actual data, or the dummy data to be discarded may be further included in the single data set. Accordingly, the semiconductor memory device may have the improved or enhanced bandwidth and signal integrity characteristics without excessively increasing costs.

BRIEF DESCRIPTION OF THE DRAWINGS

Illustrative, non-limiting example embodiments will be more clearly understood from the following detailed description taken in conjunction with the accompanying drawings.

FIGS. 5, 6, 7, 8, 9A, 9B, 9C, 10 and 11 are diagrams for describing an operation of a semiconductor memory device according to example embodiments.

DETAILED DESCRIPTION OF THE EMBODIMENTS

Figure 1:
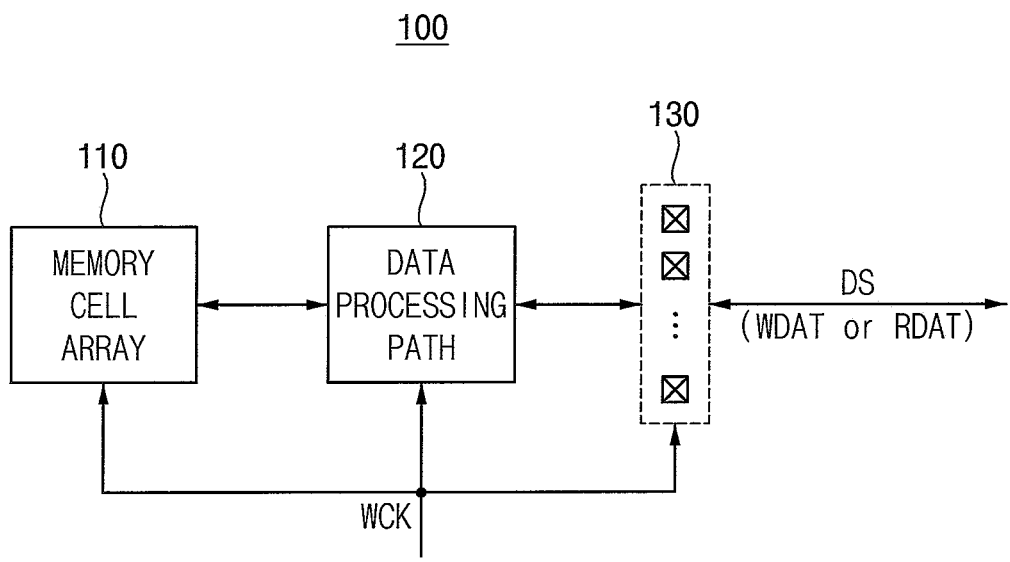
FIG. 1 is a block diagram illustrating a semiconductor memory device according to example embodiments.

Various example embodiments will be described more fully with reference to the accompanying drawings, in which embodiments are shown. The present disclosure may, however, be embodied in many different forms and should not be construed as limited to the embodiments set forth herein. Like reference numerals refer to like elements throughout this application.

FIG. 1 is a block diagram illustrating a semiconductor memory device according to example embodiments.

Referring to FIG. 1, a semiconductor memory device 100 includes a memory cell array 110, a data processing path 120, and a plurality of data input/output (I/O) pins 130.

The memory cell array 110 stores data. For example, the memory cell array 110 may include a plurality of memory cells for storing data.

In some example embodiments, the semiconductor memory device 100 may be a volatile memory device. For example, the semiconductor memory device 100 may be a dynamic random access memory (DRAM), and the memory cell array 110 may include a plurality of dynamic memory cells.

The plurality of data I/O pins 130 receive write data WDAT to be stored in the memory cell array 110 or output read data RDAT stored in (and retrieved from) the memory cell array 110. For example, a pin may be a contact pad or a contact pin, but example embodiments are not limited thereto.

The data processing path 120 may be disposed or located between the memory cell array 110 and the plurality of data I/O pins 130, and may perform a data processing for storing the write data WDAT in the memory cell array 110 or a data processing for outputting the read data RDAT.

The memory cell array 110, the data processing path 120 and the plurality of data I/O pins 130 may operate based on a data clock signal WCK.

The semiconductor memory device 100 may perform a data write operation or a data read operation. For example, when a write command is received from outside the semiconductor memory device 100 (e.g., from an external memory controller), the semiconductor memory device 100 may perform the data write operation in which the write data WDAT is stored in the memory cell array 110 based on the write command, and the write data WDAT may be received through the plurality of data I/O pins 130 during the data write operation. When a read command is received from the outside, the semiconductor memory device 100 may perform the data read operation in which the read data RDAT stored in the memory cell array 110 is retrieved based on the read command, and the read data RDAT may be output through the plurality of data I/O pins 130 during the data read operation.

The semiconductor memory device 100 may perform a burst operation in which a single data set DS including a plurality of data bits is input or output through the plurality of data I/O 130 pins based on a single command received from the outside (e.g., from the external memory controller).

The operation of receiving the write data WDAT during the data write operation and the operation of outputting the read data RDAT during the data read operation may be performed based on the burst operation. For example, the single data set DS may include the write data WDAT or the read data RDAT. For example, the single data set DS including the write data WDAT may be input through the plurality of data I/O pins 130 based on a single write command. For example, the single data set DS including the read data RDAT may be output through the plurality of data I/O pins 130 based on a single read command.

In the semiconductor memory device 100 according to example embodiments, the number (or quantity) of the plurality of data I/O pins 130 may correspond to an integer that is not a power-of-two (e.g., an integer other than power-of-two), and a burst length representing a unit of the burst operation may correspond to an integer that is not a power-of-two, which will be described with reference to FIG. 2.

Figure 2:
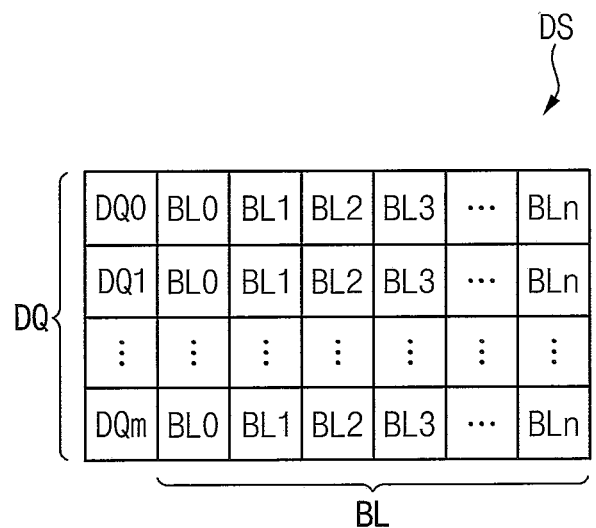
FIG. 2 is a diagram for describing a burst operation performed in a semiconductor memory device according to example embodiments.

FIG. 2 is a diagram for describing a burst operation performed in a semiconductor memory device according to example embodiments.

Referring to FIG. 2, an example of the single data set DS that is input or output through a plurality of data I/O pins DQ based on a single command during the burst operation is illustrated.

Figure 3:
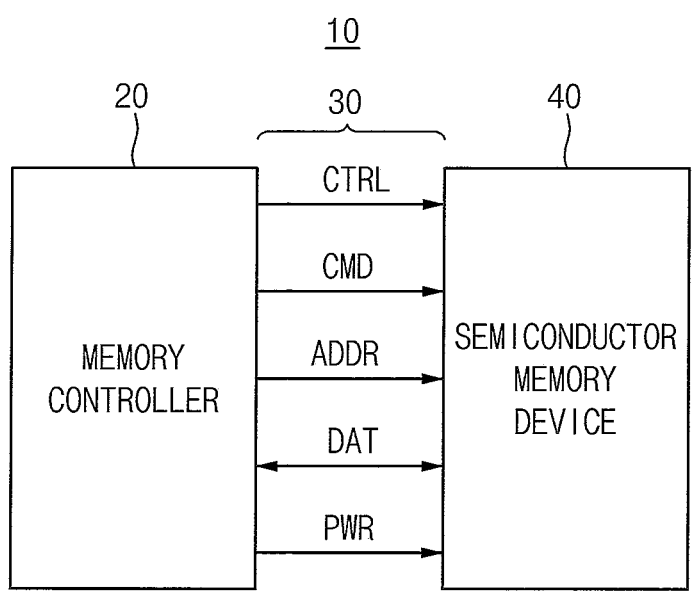
FIG. 3 is a block diagram illustrating a memory system including a semiconductor memory device according to example embodiments.

The burst operation represents an operation of writing and/or reading a large amount of data into and/or from a semiconductor memory device (e.g., the semiconductor memory device 100 of FIG. 1) by sequentially increasing and/or decreasing an initial address that is provided from a memory controller (e.g., a memory controller 20 in FIG. 3)

to the semiconductor memory device. A basic unit of the burst operation may be referred to a burst length BL.

FIG. 2 illustrates an example where the plurality of data I/O pins DQ include first to (m+1)-th data I/O pins DQ0, . . . , DQ1, DQm, e.g., (m+1) data I/O pins, where m is a natural number greater than or equal to two. In addition, FIG. 2 illustrates an example where the burst length BL is (n+1), where n is a natural number greater than or equal to four.

The single data set DS may include a plurality of data bits BL0, BL1, BL2, BL3, . . . , BLn. The total number of the plurality of data bits BL0 to BLn may correspond to a value obtained by multiplying the number of data I/O pins DQ0 to DQm and the burst length BL, e.g., (m+1)*(n+1), and may represent a unit of information that is transmitted (e.g., input or output) at a time based on the single command.

During the burst operation, the data bits BL0 to BLn may be sequentially input or output through the data I/O pins DQ0 to DQm based on the data clock signal WCK. For example, the (m+1) data bits BL0 may be simultaneously input or output through the (m+1) data I/O pins DQ0 to DQm. Next, the (m+1) data bits BL1 may be simultaneously input or output through the (m+1) data I/O pins DQ0 to DQm. Thereafter, the (m+1) data bits BL2 may be simultaneously input or output through the (m+1) data I/O pins DQ0 to DQm. Thereafter, the (m+1) data bits BL3 may be simultaneously input or output through the (m+1) data I/O pins DQ0 to DQm. Finally, the (m+1) data bits BLn may be simultaneously input or output through the (m+1) data I/O pins DQ0 to DQm. As a result, the (n+1) data bits BL0 to BLn corresponding to the burst length BL may be sequentially input through one data I/O pin (e.g., through the data I/O pin DQ0).

In the semiconductor memory device 100 according to example embodiments, the number of data I/O pins DQ0 to DQm, e.g., (m+1) may correspond to an integer that is not a power-of-two. In addition, the burst length BL, e.g., (n+1) may correspond to an integer that is not a power-of-two. For example, at least one of the number of data I/O pins DQ0 to DQm and the burst length BL may correspond to an integer that is a multiple-of-three.

As described with reference to FIG. 1, the single data set DS may include the write data WDAT or the read data RDAT. In this case, the plurality of data bits BL0 to BLn included in the single data set DS may include first data bits corresponding to the write data WDAT or the read data RDAT. For example, the first data bits may represent actual data (e.g., user data, or the like) that is actually to be written or read. For example, the number of the first data bits may correspond to an integer that is a power-of-two.

In some example embodiments, the single data set DS may further include additional data associated with or related to the write data WDAT or the read data RDAT. In this case, the plurality of data bits BL0 to BLn included in the single data set DS may further include second data bits other than the first data bits, and the second data bits may correspond to the additional data. For example, the additional data may include at least one of data bus inversion (DBI) information, error correction code (ECC) information (e.g., parity bits), and metadata that are required for writing or reading the actual data, but example embodiments are not limited thereto. For example, the number of the second data bits may correspond to an integer that is a power-of-two.

In other example embodiments, the single data set DS may further include dummy data irrelevant to (or independent of) the write data WDAT or the read data RDAT. In this case, the plurality of data bits BL0 to BLn included in the single data set DS may further include second data bits other than the first data bits, and the second data bits may correspond to the dummy data. For example, the dummy data may represent data discarded without being used to write or read the actual data. For example, the number of the second data bits may correspond to an integer that is a power-of-two.

In some example embodiments, even though both the number of the first data bits and the number of the second data bits correspond to an integer that is a power-of-two, the number of the plurality of data bits BL0 to BLn including the first data bits and the second data bits, e.g., (m+1)*(n+1) may correspond to an integer that is not a power-of-two.

Conventionally, in order to transmit a number of pieces of information (e.g., data bits) corresponding to an integer that is a power-of-two during a burst operation, all or at least one of a burst length and the number of data I/O pins were implemented to correspond to an integer that is a power-of-two. For example, $2^x$ data bits were transferred at a time based on a single command by implementing the burst length and the number of data I/O pins as $2^y$ and $2^z$, respectively, where each of x, y and z is natural number and x=y+z.

To improve or enhance the bandwidth of the semiconductor memory device, it may be necessary to increase the burst length or the number of data I/O pins. However, if the above-described conventional scheme is used, there is a difficulty in implementation because all or at least one of the burst length and the number of data I/O pins should be implemented to correspond to an integer that is a power-of-two. For example, if the burst length is doubled, a problem in which the signal integrity characteristics are severely degraded or deteriorated due to a lack of the data window may occur. For example, if the number of data I/O pins is doubled, there may be a problem in that the manufacturing cost is excessively increased.

In the semiconductor memory device 100 according to example embodiments, both the burst length and the number of data I/O pins may be implemented to correspond to an integer that is not a power-of-two. Even if both the burst length and the number of data I/O pins correspond to an integer that is not a power-of-two, the actual data to be written or read may be implemented to include a number of pieces of information (e.g., data bits) corresponding to an integer that is a power-of-two. In addition, the additional data required for writing or reading the actual data, or the dummy data to be discarded may be further included in the single data set DS. Accordingly, the semiconductor memory device 100 may have the improved or enhanced bandwidth and signal integrity characteristics without excessively increasing costs.

For example, even if the burst length and the number of data I/O pins do not correspond to $2^y$ and $2^z$, respectively, it may be implemented that a value obtained by multiplying the burst length and the number of data I/O pins corresponds to $2^x$ such that $2^x$ information (e.g., data bits) are transmitted. For another example, $2^x$ information may be implemented by discarding some bits, if necessary. Alternatively, when a total of $2^x+a$ information are transmitted with the additional data including the DBI information, the ECC information and/or metadata, it may be implemented that a value obtained by multiplying the burst length and the number of data I/O pins corresponds to $2^x+a$, even if the burst length and the number of data I/O pins do not correspond to $2^y$ and $2^z$, respectively, where a is a natural number.

FIG. 3 is a block diagram illustrating a memory system including a semiconductor memory device according to example embodiments.

Referring to FIG. 3, a memory system 10 includes a memory controller 20 and a semiconductor memory device 40. The memory system 10 may further include a plurality of signal lines 30 that electrically connect the memory controller 20 with the semiconductor memory device 40.

The semiconductor memory device 40 is controlled by the memory controller 20. For example, based on requests from a host device (not illustrated), the memory controller 20 may store (e.g., write or program) data into the semiconductor memory device 40, or may retrieve (e.g., read or sense) data from the semiconductor memory device 40.

The plurality of signal lines 30 may include control lines, command lines, address lines, data input/output (I/O) lines and power lines. The memory controller 20 may transmit a command CMD, an address ADDR and a control signal CTRL to the semiconductor memory device 40 via the command lines, the address lines and the control lines, may exchange data DAT with the semiconductor memory device 40 via the data I/O lines, and may transmit a power supply voltage PWR to the semiconductor memory device 40 via the power lines. Although not illustrated in FIG. 3, the plurality of signal lines 30 may further include data strobe signal (DQS) lines for transmitting a DQS signal.

The semiconductor memory device 40 may be the semiconductor memory device according to example embodiments. For example, as described with reference to FIGS. 1 and 2, the semiconductor memory device 40 includes data I/O pins, the number of which corresponds to an integer of non-power-of-two, and the data I/O pins may be connected to the data I/O lines to receive or output the data DAT. The data DAT may include a data set for performing the burst operation, and a burst length of the data set may correspond to an integer that is not a power-of-two.

In some example embodiments, at least a part of, or all of, the signal lines 30 may be referred to as a channel. The term "channel" as used herein may represent signal lines that include the data I/O lines for transmitting the data DAT. However, example embodiments are not limited thereto, and the channel may further include the command lines for transmitting the command CMD and/or the address lines for transmitting the address ADDR.

Figure 4:
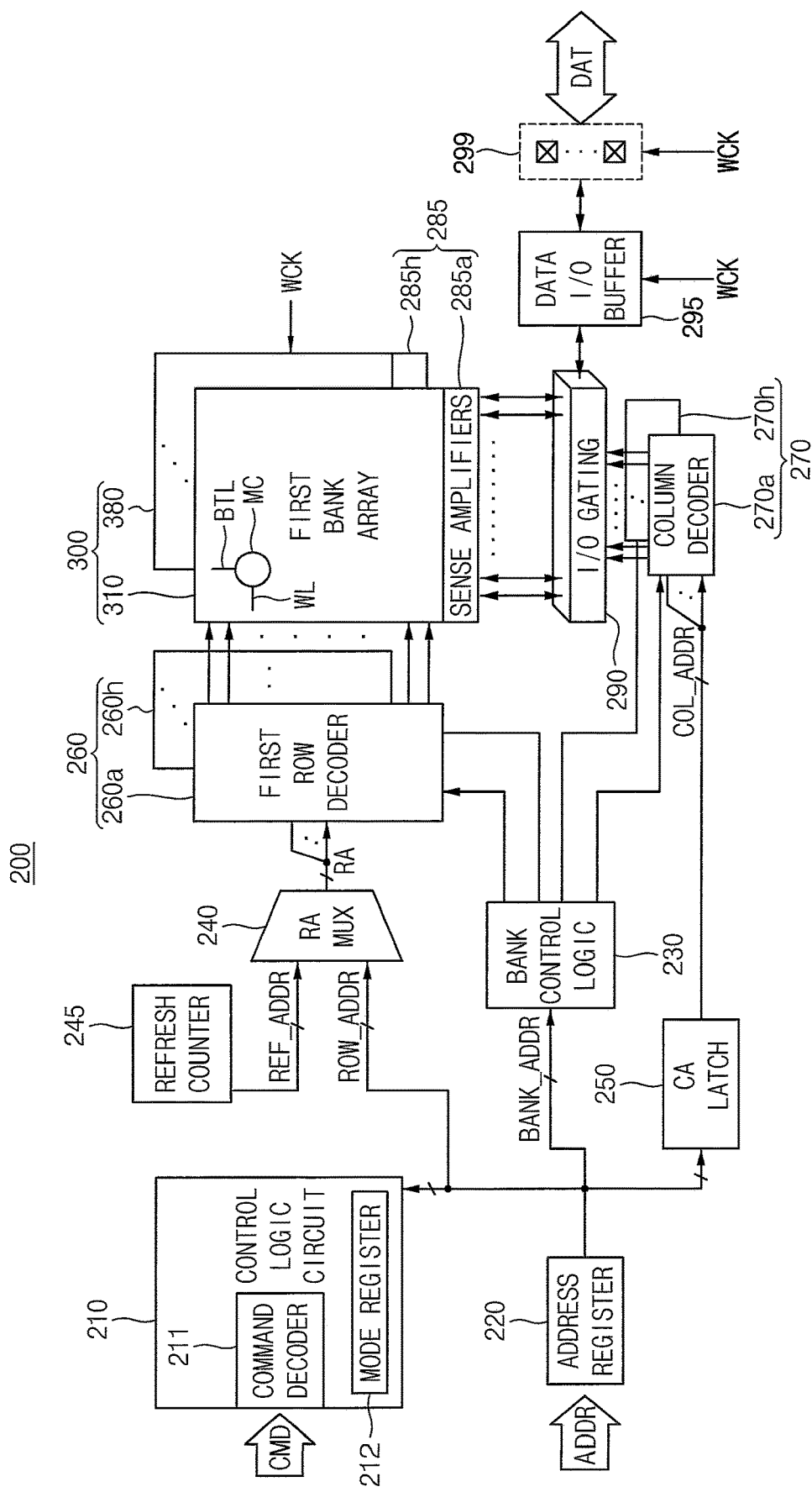
FIG. 4 is a block diagram illustrating an example of a semiconductor memory device of FIG. 1.

FIG. 4 is a block diagram illustrating an example of a semiconductor memory device of FIG. 1.

Referring to FIG. 4, a semiconductor memory device 200 may include a control logic circuit 210, an address register 220, a bank control logic circuit 230, a row address multiplexer 240, a refresh counter 245, a column address latch 250, a row decoder 260, a column decoder 270, a memory cell array 300, a sense amplifier unit 285, an input/output (I/O) gating circuit 290, a data I/O buffer 295 and/or data I/O pins 299. For example, the semiconductor memory device 200 may be a DRAM.

The memory cell array 300 may include first to eighth bank arrays 310 to 380 (e.g., first to eighth bank arrays 310, 320, 330, 340, 350, 360, 370 and 380). The row decoder 260 may include first to eighth bank row decoders 260a to 260h connected to the first to eighth bank arrays 310 to 380, respectively. The column decoder 270 may include first to eighth bank column decoders 270a to 270h connected to the first to eighth bank arrays 310 to 380, respectively. The sense amplifier unit 285 may include first to eighth bank sense amplifiers 285a to 285h connected to the first to eighth bank arrays 310 to 380, respectively.

The first to eighth bank arrays 310 to 380, the first to eighth bank row decoders 260a to 260h, the first to eighth bank column decoders 270a to 270h, and the first to eighth bank sense amplifiers 285a to 285h may form first to eighth banks. Each of the first to eighth bank arrays 310 to 380 may include a plurality of wordlines WL, a plurality of bitlines BTL, and a plurality of memory cells MC formed at intersections of the wordlines WL and the bitlines BTL.

Although FIG. 4 illustrates the semiconductor memory device 200 including eight banks, the semiconductor memory device 200 may include any number of banks; for example, one, two, four, eight, sixteen, or thirty two banks, or any number therebetween one and thirty two.

The address register 220 may receive the address ADDR including a bank address BANK_ADDR, a row address ROW_ADDR and a column address COL_ADDR from a memory controller (e.g., the memory controller 20 in FIG. 3). The address register 220 may provide the received bank address BANK_ADDR to the bank control logic circuit 230, may provide the received row address ROW_ADDR to the row address multiplexer 240, and may provide the received column address COL_ADDR to the column address latch 250.

The bank control logic circuit 230 may generate bank control signals in response to the bank address BANK_ADDR. One of the first to eighth bank row decoders 260a to 260h corresponding to the bank address BANK_ADDR may be activated in response to the bank control signals, and one of the first to eighth bank column decoders 270a to 270h corresponding to the bank address BANK_ADDR may be activated in response to the bank control signals.

The row address multiplexer 240 may receive the row address ROW_ADDR from the address register 220, and may receive a refresh row address REF_ADDR from the refresh counter 245. The row address multiplexer 240 may selectively output the row address ROW_ADDR or the refresh row address REF_ADDR as a row address RA. The row address RA that is output from the row address multiplexer 240 may be applied to the first to eighth bank row decoders 260a to 260h.

The activated one of the first to eighth bank row decoders 260a to 260h may decode the row address RA that is output from the row address multiplexer 240, and may activate a wordline WL corresponding to the row address RA. For example, the activated bank row decoder may generate a wordline driving voltage, and may apply the wordline driving voltage to the wordline WL corresponding to the row address RA.

The column address latch 250 may receive the column address COL_ADDR from the address register 220, and may temporarily store the received column address COL_ADDR. In some example embodiments, in a burst mode performing the burst operation, the column address latch 250 may generate column addresses that increment from the received column address COL_ADDR. The column address latch 250 may apply the temporarily stored or generated column address to the first to eighth bank column decoders 270a to 270h.

The activated one of the first to eighth bank column decoders 270a to 270h may decode the column address COL_ADDR that is output from the column address latch 250, and may control the I/O gating circuit 290 to output data corresponding to the column address COL_ADDR.

The I/O gating circuit 290 may include circuitry for gating input/output data. The I/O gating circuit 290 may further include read data latches for storing data that is output from the first to eighth bank arrays 310 to 380, and may also include write control devices for writing data to the first to eighth bank arrays 310 to 380.

Data DAT read from one of the first to eighth bank arrays 310 to 380 may be sensed by a sense amplifier connected to the one bank array from which the data DAT is to be read, and may be stored in the read data latches. The data DAT stored in the read data latches may be provided to the memory controller via the data I/O buffer 295 and the data I/O pins 299.

Data DAT to be written in one of the first to eighth bank arrays 310 to 380 may be provided from the memory controller via the data I/O buffer 295 and the data I/O pins 299. The received data DAT may be provided to the I/O gating circuit 290, and the I/O gating circuit 290 may write the data DAT in a sub-page of a target page in one bank array through the write drivers.

The data I/O buffer 295 may receive the data DAT from the memory controller and may provide the received data DAT to the I/O gating circuit 290 in a write operation of the semiconductor memory device 200, and may provide the data DAT from the I/O gating circuit 290 to the memory controller in a read operation of the semiconductor memory device 200.

The control logic circuit 210 may control operations of the semiconductor memory device 200. For example, the control logic circuit 210 may generate control signals for the semiconductor memory device 200 to perform the write operation and/or the read operation. The control logic circuit 210 may include a command decoder 211 that decodes the command CMD received from the memory controller, and a mode register 212 that sets an operation mode of the semiconductor memory device 200. In some example embodiments, operations described herein as being performed by the control logic circuit 210 may be performed by processing circuitry. For example, the command decoder 211 may generate the control signals corresponding to the command CMD by decoding a write enable signal, a row address strobe signal, a column address strobe signal, a chip select signal, etc.

The memory cell array 300 may correspond to the memory cell array 110 in FIG. 1. The sense amplifier unit 285, the I/O gating circuit 290, and the data I/O buffer 295, etc. may correspond to the data processing path 120 in FIG. 1. The data I/O pins 299 may correspond to the plurality of data I/O pins 130 in FIG. 1. The memory cell array 300, the data I/O buffer 295 and the data I/O pins 299 may operate based on the data clock signal WCK. Although not illustrated in detail, the sense amplifier unit 285, the I/O gating circuit 290, etc. may also operate based on the data clock signal WCK. For example, the data clock signal WCK may be received from the memory controller or may be internally generated in the semiconductor memory device 200.

FIGS. 5, 6, 7, 8, 9A, 9B, 9C, 10 and 11 are diagrams for describing an operation of a semiconductor memory device according to example embodiments.

Figure 5:
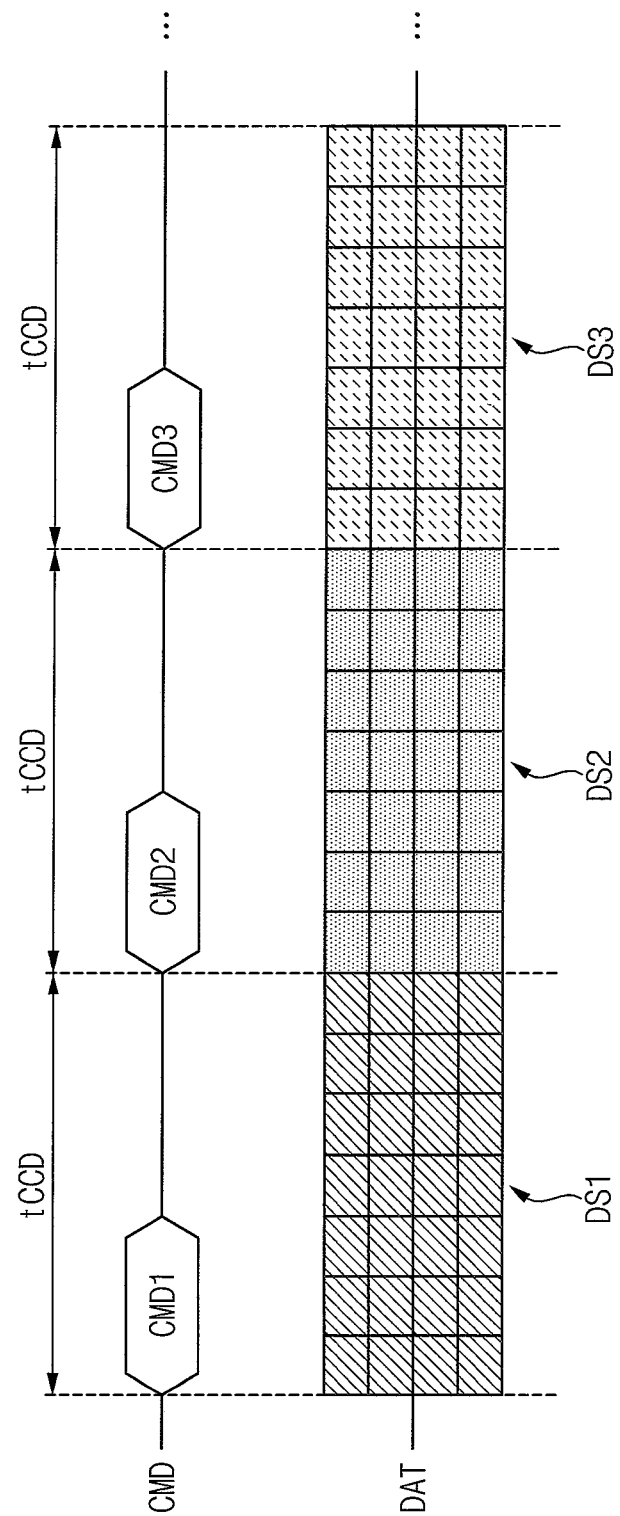

Referring to FIG. 5, an example in a burst operation is illustrated. In an example of FIG. 5, a plurality of commands CMD1, CMD2 and CMD3 may be continuously or sequentially received, and thus a plurality of data sets DS1, DS2 DS3 corresponding to the plurality of commands CMD1 to CMD3 may be continuously or sequentially received. In addition, tCCD may represent the minimum time interval required between two successive commands.

For example, when the plurality of commands CMD1 to CMD3 are write commands, the plurality of data sets DS1 to and DS3 including write data may be continuously input through a plurality of data I/O pins, and a data write operation may be performed based on the write commands and the write data. For example, when the plurality of commands CMD1 to CMD3 are read commands, a data read operation may be performed based on the read commands to obtain read data, and the plurality of data sets DS1 to and DS3 including the read data may be continuously output through the plurality of data I/O pins.

Figure 6:
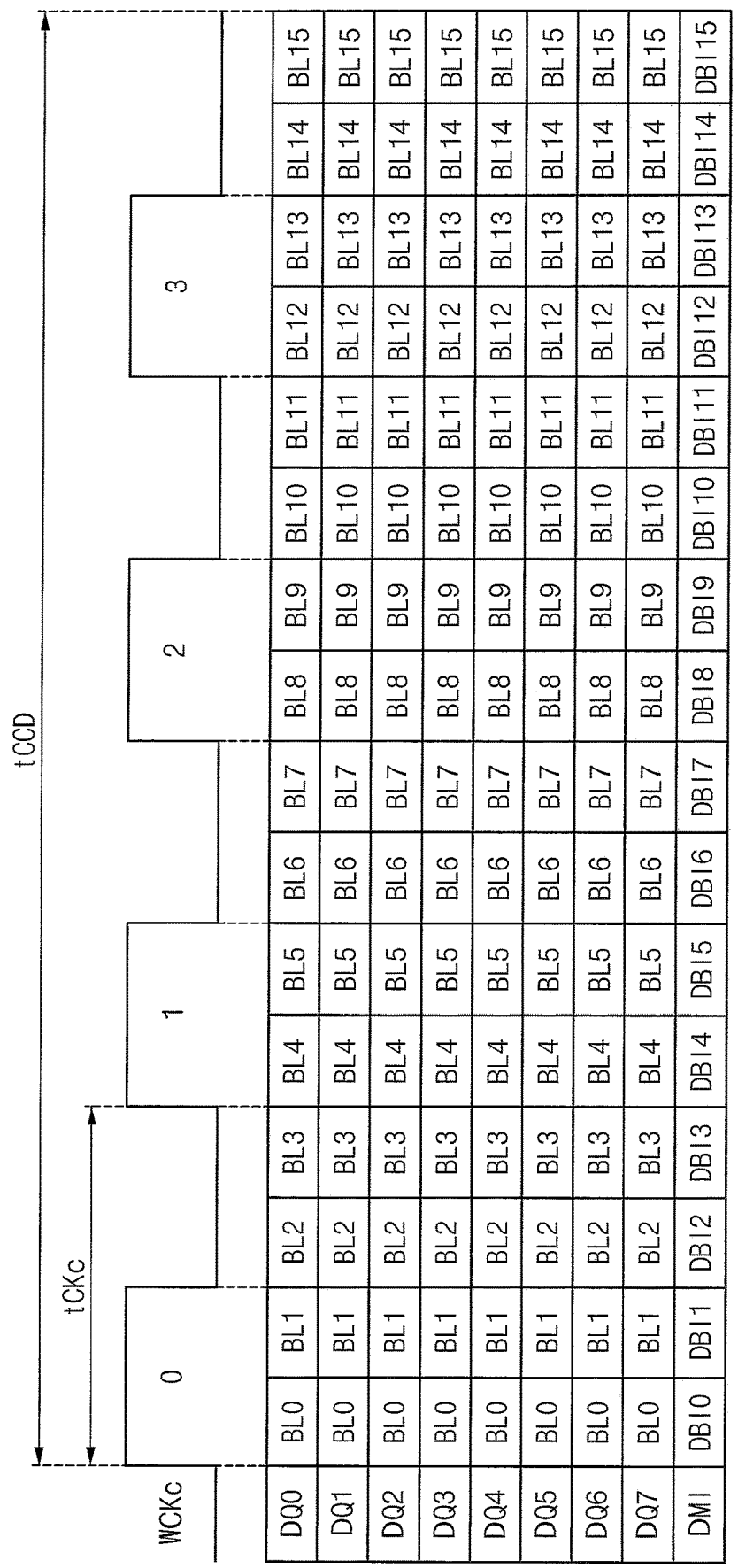

Referring to FIG. 6, a conventional (or existing) example where both the burst length and the number of data I/O pins are implemented to correspond to an integer that is a power-of-two is illustrated. For example, FIG. 6 illustrates an example a single data set (e.g., the data set DS1 in FIG. 5) that is input or output based on a single command (e.g., the command CMD1 in FIG. 5).

In the example of FIG. 6, the burst length may be $2^4=16$, the number of data I/O pins DQ0, DQ1, DQ2, DQ3, DQ4, DQ5, DQ6 and DQ7 may be $2^3=8$, and thus the single data set may include 16*8=128 data bits BL0, BL1, BL2, BL3, BL4, BL5, BL6, BL7, BL8, BL9, BL10, BL11, BL12, BL13, BL14 and BL15. In addition, one data mask inversion (DMI) I/O pin for additional information may be additionally formed, and the single data set may further include 16 DBI bits DBI0, DBI1, DBI2, DBI3, DBI4, DBI5, DBI6, DBI7, DBI8, DBI9, DBI10, DBI11, DBI12, DBI13, DBI14 and DBI15 received through the DMI I/O pin. For example, as described with reference to FIG. 2, the single data set may further include the additional data associated with the write data WDAT or the read data RDAT, and the DBI bits DBI0 to DBI15 may correspond to the DBI information included in the additional data.

Therefore, in the example of FIG. 6, the single data set that is transmitted based on the single command may include a total of 144 (=128+16) bits transferred through a total of 9 (=8+1) I/O pins.

In addition, in the example of FIG. 6, the data bits BL0 to BL15 and the DBI bits DBI0 to DBI15 may be input or output based on a data clock signal WCKc, and the data transmission operation may be performed based on a quad data rate (QDR) scheme in which four bits are transmitted during one period (or cycle) tCKc of the data clock signal WCKc. Thus, four periods of the data clock signal WCKc may be repeated within tCCD (e.g., tCCD=4*tCKc), and the burst length of 16 may be implemented.

In a conventional low power double data rate 5 (LPDDR5) standard, a burst operation is implemented using two data sets illustrated in FIG. 6. In this case, the burst length is 16, the number of data I/O pins is 16, and a total of 256 data bits are transmitted. Further, 32 DBI bits are transmitted through two DMI I/O pins. Thus, a total of 288 bits may be transmitted through a total of 18 I/O pins in one burst operation. For example, when tCCD is about 1.88 nanoseconds (ns), the period tCKc of the data clock signal WCKc may be about 470 picoseconds (ps), and a time required to transmit one bit (e.g., one unit interval (UI)) may be about 118 ps.

Figure 7:
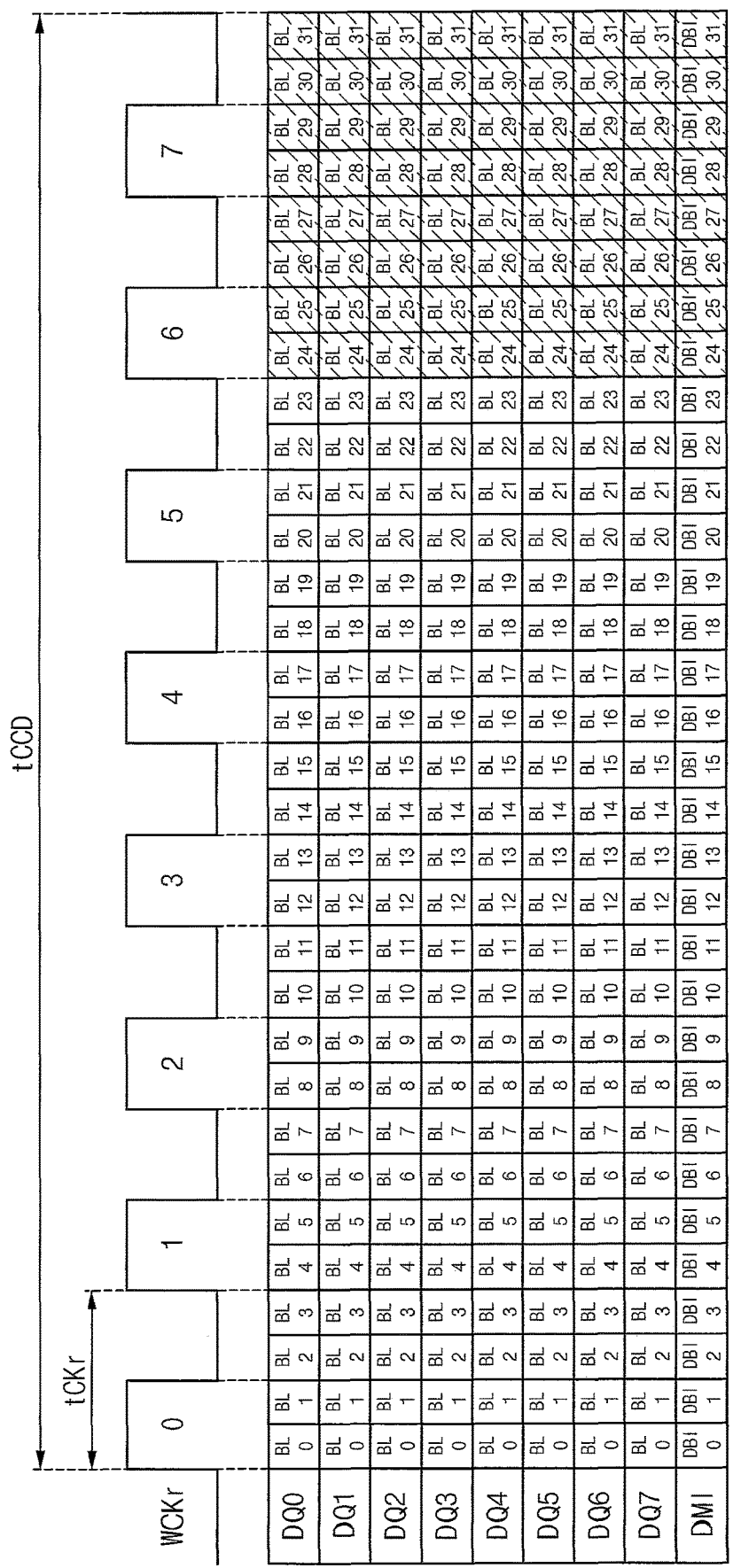

Referring to FIG. 7, a conventional (or existing) example where both the burst length and the number of data I/O pins are implemented to correspond to an integer that is a power-of-two is illustrated. In addition, FIG. 7 illustrates an example where the bandwidth is doubled as compared with FIG. 6. As with the example of FIG. 6, FIG. 7 illustrates an example where a single data set is input or output based on a single command.

In the example of FIG. 7, the burst length may be $2^5=32$, the number of data I/O pins DQ0, DQ1, DQ2, DQ3, DQ4, DQ5, DQ6 and DQ7 may be $2^3=8$, and thus the single data set may include 32*8=256 data bits BL0, BL1, BL2, BL3, BL4, BL5, BL6, BL7, BL8, BL9, BL10, BL11, BL12, BL13, BL14, BL15, BL16, BL17, BL18, BL19, BL20, BL21, BL22, BL23, BL24, BL25, BL26, BL27, BL28, BL29, BL30 and BL31. In addition, one DMI I/O pin for additional information may be additionally formed, and the single data set may further include 32 DBI bits DBI0, DBI1, DBI2, DBI3, DBI4, DBI5, DBI6, DBI7, DBI8, DBI9, DBI10, DBI11, DBI12, DBI13, DBI14, DBI15, DBI16, DBI17, DBI18, DBI19, DBI20, DBI21, DBI22, DBI23, DBI24, DBI25, DBI26, DBI27, DBI28, DBI29, DBI30 and DBI31 received through the DMI I/O pin. For example, the DBI bits DBI0 to DBI31 may correspond to the DBI information described with reference to FIG. 2.

Therefore, in the example of FIG. 7, the single data set that is transmitted based on the single command may include a total of 288 (=256+32) bits transferred through a total of 9 (=8+1) I/O pins.

In addition, in the example of FIG. 7, the data bits BL0 to BL31 and the DBI bits DBI0 to DBI31 may be input or output based on a data clock signal WCKr, and the data transmission operation may be performed based on the QDR scheme in which four bits are transmitted during one period tCKr of the data clock signal WCKr. Thus, eight periods of the data clock signal WCKr may be repeated within tCCD (e.g., tCCD=8*tCKr), and the burst length of 32 may be implemented.

In a low power double data rate 6 (LPDDR6) standard, which is the next-generation standard being discussed recently, there is a consideration where a burst operation is implemented using two data sets illustrated in FIG. 7 for doubling the bandwidth as compared to the LPDDR5 standard. In this case, the burst length is 32, the number of data I/O pins is 16, and a total of 512 data bits are transmitted. Further, 64 DBI bits are transmitted through two DMI I/O pins. Thus, a total of 576 bits may be transmitted through a total of 18 I/O pins in one burst operation. As a result, in the example of FIG. 7, the burst length may be doubled (16→32), the number of bits included in the single data set may be doubled (144→288), and thus the bandwidth may be doubled, as compared with the example of FIG. 6. However, in the example of FIG. 7, the period tCKr of the data clock signal WCKr may be reduced to about ½, as compared with the example of FIG. 6. For example, when tCCD is equal to about 1.88 ns, the period tCKr of the data clock signal WCKr may be reduced to about 235 ps, and a time required to transmit one bit may be reduced to about 59 ps (e.g., 1 UI=59 ps), as compared with the example of FIG. 6. As a result, in the example of FIG. 7, a problem in which the signal integrity characteristic is severely degraded or deteriorated may occur, as compared with the example of FIG. 6.

Although not illustrated in detail, there may be a consideration of doubling the bandwidth by doubling the number of I/O pins. However, in this case, a problem in which the manufacturing cost is excessively increased may occur.

Referring to FIG. 8, an example where both the burst length and the number of data I/O pins are implemented to correspond to an integer that is not a power-of-two according to example embodiments is illustrated. In addition, FIG. 8 illustrates an example where the bandwidth is doubled as compared with FIG. 6. For example, both the burst length and the number of data I/O pins may be implemented to correspond to an integer that is a multiple-of-three. As with the examples of FIGS. 6 and 7, FIG. 8 illustrates an example where a single data set is input or output based on a single command.

In the example of FIG. 8, the burst length may be 24(=3*2³), and the number of data I/O pins DQ0, DQ1, DQ2, DQ3, DQ4, DQ5, DQ6, DQ7, DQ8, DQ9, DQ10 and DQ11 may be 12(=3*2²). In this case, the single data set that is transmitted based on the single command may include a total of 288 (=24*12) bits BL0 to BL31 and DBI0 to DBI31 transferred through a total of 12 I/O pins. In other words, in the example of FIG. 8, the same number of bits may be transmitted, as compared with the example of FIG. 7.

In addition, in the example of FIG. 8, the data bits BL0 to BL31 and the DBI bits DBI0 to DBI31 may be input or output based on the data clock signal WCK, and the data transmission operation may be performed based on the QDR scheme in which four bits are transmitted during one period tCK of the data clock signal WCK. Thus, six periods of the data clock signal WCK may be repeated within tCCD (e.g., tCCD=6*tCK), and the burst length of 24 may be implemented.

In the example of FIG. 8, the burst length may be increased by about 1.5 times (16→24), the number of I/O pins may be increased by about 1.33 times (9→12), the number of bits included in the single data set may be doubled (144→288), and thus the bandwidth may be doubled, as compared with the example of FIG. 6. In addition, in the example of FIG. 8, the period tCK of the data clock signal WCK may be reduced to about ⅔, as compared with the example of FIG. 6. For example, when tCCD is equal to about 1.88 ns, the period tCK of the data clock signal WCK may be reduced to about 313 ps, and a time required to transmit one bit may be reduced to about 78 ps (e.g., 1 UI=78 ps), as compared with the example of FIG. 6. As a result, in the example of FIG. 8, the bandwidth of the semiconductor memory device may be efficiently improved without excessive degradation of the signal integrity characteristic (e.g., while ensuring the signal integrity characteristic), as compared with the example of FIG. 7. Further, in the example of FIG. 8, the number of I/O pins may not be excessively increased (e.g., increased by about 1.33 times) as compared with the example of FIG. 6, and thus the bandwidth of the semiconductor memory device may be efficiently improved without excessive cost increase (e.g., with minimal cost increase).

In the example of FIG. 8, the data bits BL24, BL25, BL26, BL27, BL28, BL29, BL30 and BL31 and the DBI bits DBI24, DBI25, DBI26, DBI27, DBI28, DBI29, DBI30 and DBI31 may be arranged, allocated, and/or mapped to correspond to the data I/O pins DQ9, DQ10 and DQ11, as compared with the example of FIG. 7. In FIGS. 7 and 8, the data bits BL24 to BL31 and the DBI bits DBI24 to DBI31 whose arrangement, allocation and/or mapping are changed are hatched. In addition, in the example of FIG. 8, the period tCK of the data clock signal WCK may be increased by about 1.33 times, and the number of I/O pins may be increased by about 1.33 times, as compared with the example of FIG. 7. Accordingly, the above-described scheme based on the example of FIG. 8 where both the burst length and the number of data I/O pins are implemented to correspond to an integer that is not a power-of-two (e.g., an integer that is a multiple-of-three) may be more suitable for the LPDDR6 standard.

In some example embodiments, the data bits BL0 to BL31 may be the first data bits that correspond to the write data WDAT or the read data RDAT described with reference to FIG. 2, and the DBI bits DBI0 to DBI31 may be the second data bits that correspond to the additional data described with reference to FIG. 2. As described above, even if the burst length is implemented to correspond to an integer that is not a power-of-two (e.g., 24) and the number of data I/O pins is also implemented to correspond to an integer of that is not a power-of-two (e.g., 12), the number of the first data bits may correspond to an integer that is a power-of-two (e.g., 256) and the number of the second data bits may correspond to an integer that is a power-of-two (e.g., 32). However, the sum of the number of the first and second data bits may correspond to an integer that is not a power-of-two (e.g., 288).

Figure 9A:
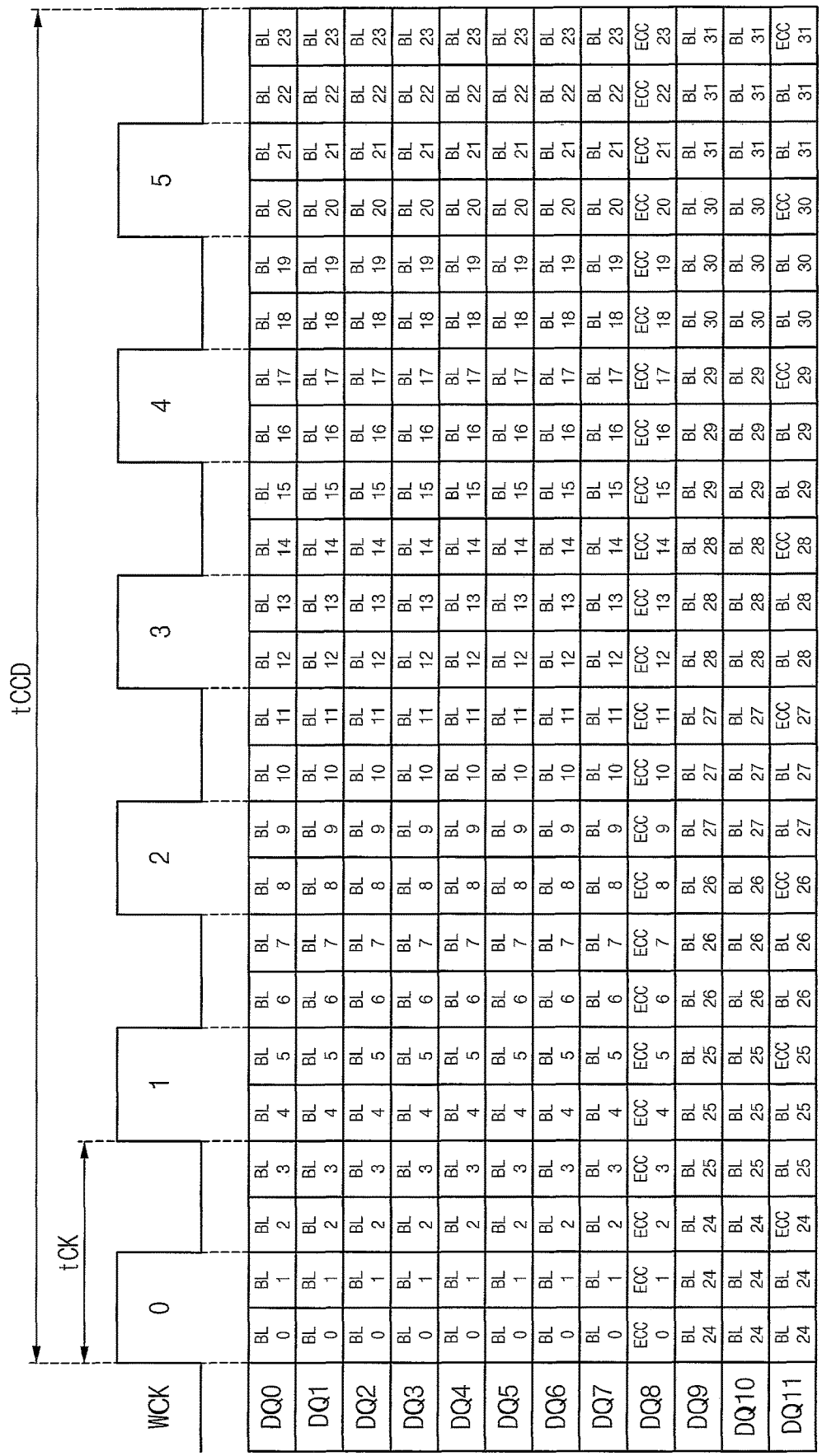
Figure 9B:
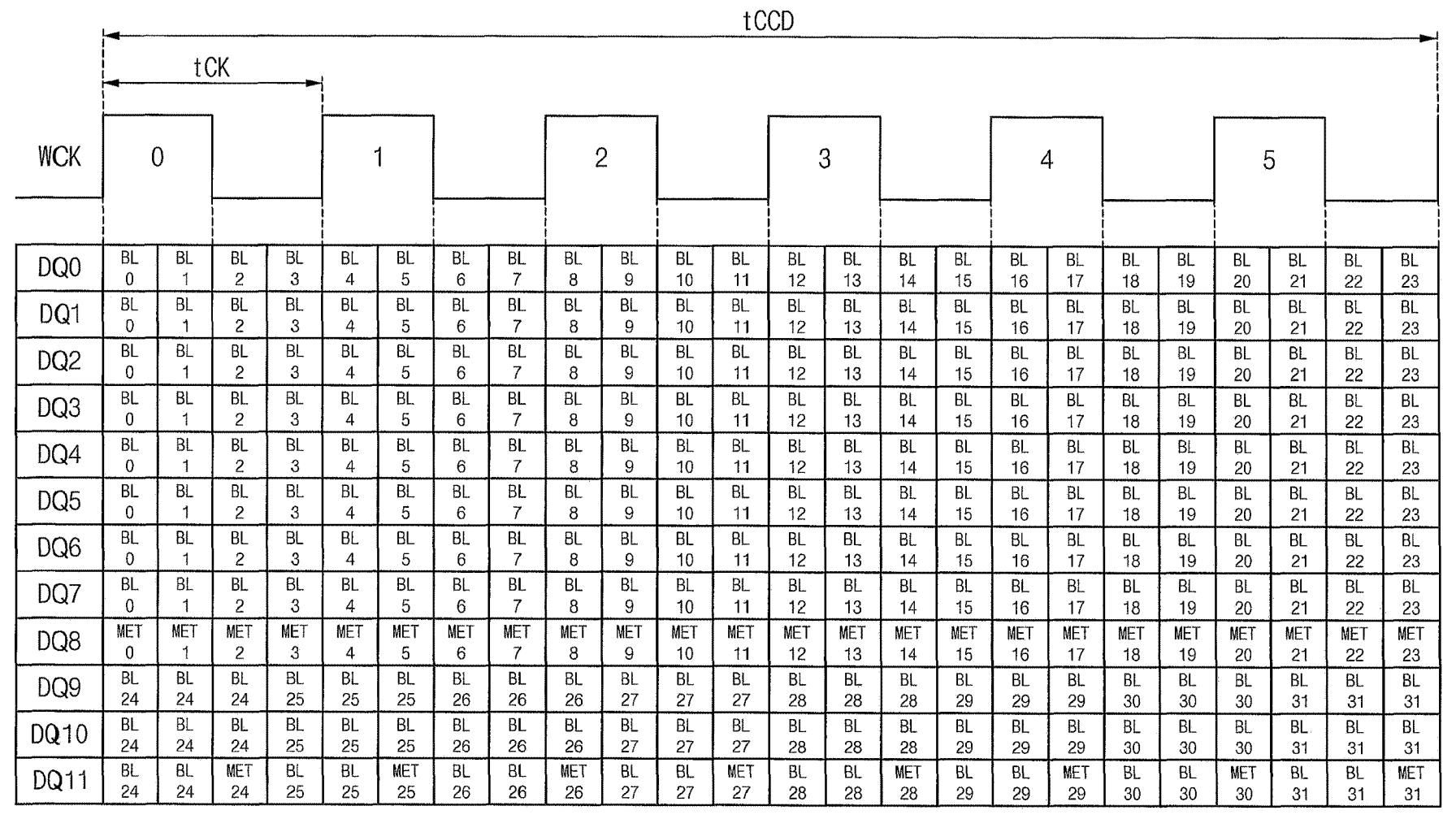
Figure 9C:
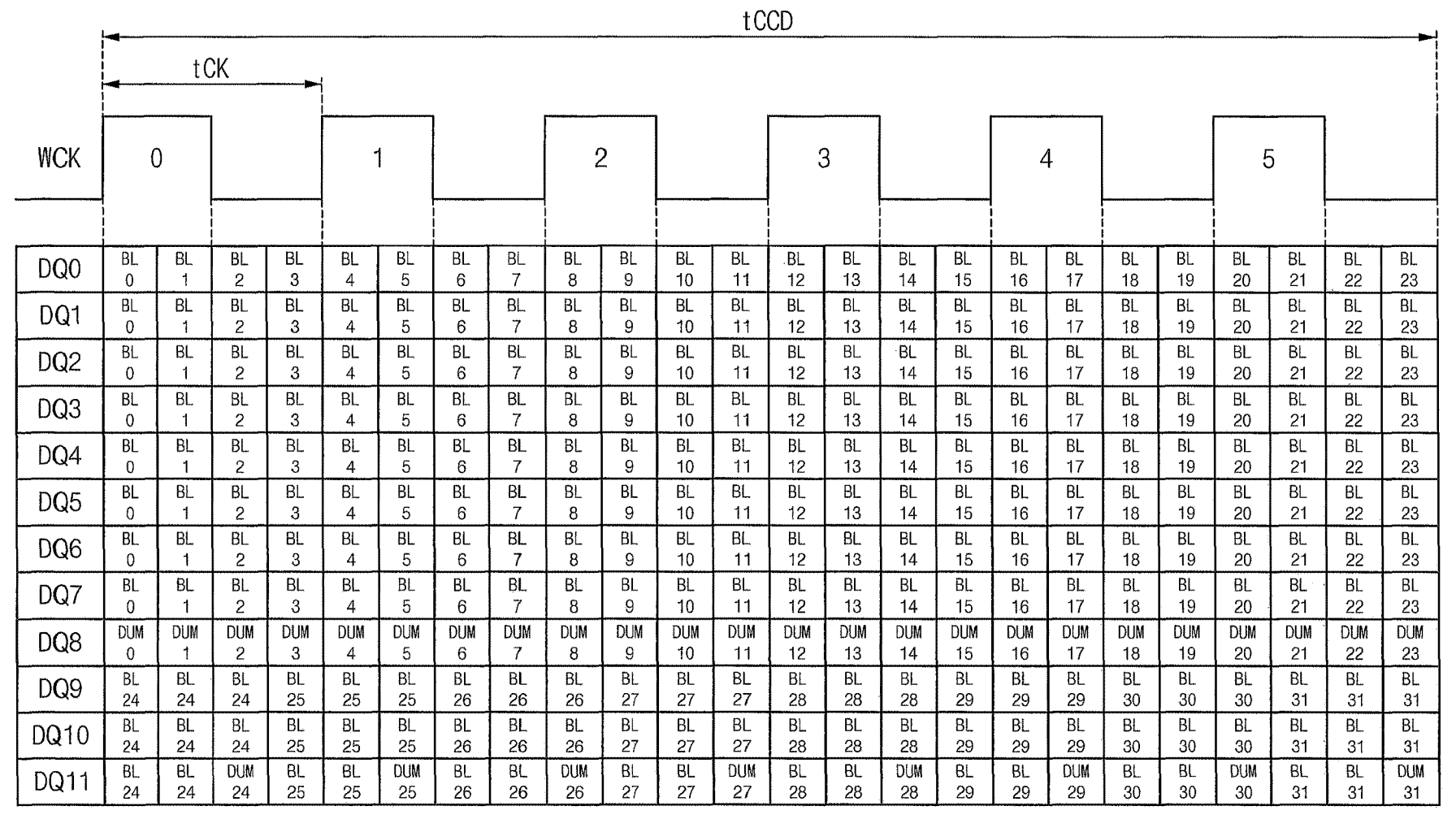

Referring to FIGS. 9A, 9B and 9C, examples where both the burst length and the number of data I/O pins are implemented to correspond to an integer that is not a power-of-two according to example embodiments are illustrated.

The examples of FIGS. 9A, 9B and 9C may be substantially the same as the example of FIG. 8, except that the DBI bits DBI0 to DBI31 in FIG. 8 are changed. The descriptions repeated with FIG. 8 will be omitted.

In the example of FIG. 9A, the DBI bits DBI0 to DBI31 in FIG. 8 may be changed to ECC bits ECC0, ECC1, ECC2, ECC3, ECC4, ECC5, ECC6, ECC7, ECC8, ECC9, ECC10, ECC11, ECC12, ECC13, ECC14, ECC15, ECC16, ECC17, ECC18, ECC19, ECC20, ECC21, ECC22, ECC23, ECC24, ECC25, ECC26, ECC27, ECC28, ECC29, ECC30 and ECC31. In other words, as described with reference to FIG. 2, the single data set may include the additional data associated with the write data WDAT or the read data RDAT, the additional data may include the ECC information, and the ECC bits ECC0 to ECC31 may correspond to the ECC information (e.g., parity bits).

In the example of FIG. 9B, the DBI bits DBI0 to DBI31 in FIG. 8 may be changed to meta bits MET0, MET1, MET2, MET3, MET4, MET5, MET6, MET7, MET8, MET9, MET10, MET11, MET12, MET13, MET14, MET15, MET16, MET17, MET18, MET19, MET20, MET21, MET22, MET23, MET24, MET25, MET26, MET27, MET28, MET29, MET30 and MET31. In other words, as described with reference to FIG. 2, the single data set may include the additional data associated with the write data WDAT or the read data RDAT, the additional data may include the metadata, and the meta bits MET0 to MET31 may correspond to the metadata.

In the example of FIG. 9C, the DBI bits DBI0 to DBI31 in FIG. 8 may be changed to dummy bits DUM0, DUM1, DUM2, DUM3, DUM4, DUM5, DUM6, DUM7, DUM8, DUM9, DUM10, DUM11, DUM12, DUM13, DUM14, DUM15, DUM16, DUM17, DUM18, DUM19, DUM20, DUM21, DUM22, DUM23, DUM24, DUM25, DUM26, DUM27, DUM28, DUM29, DUM30 and DUM31. In other words, as described with reference to FIG. 2, the single data set may include the dummy data that is not relevant to the write data WDAT or the read data RDAT, and that is not used and is discarded during the data write/read operation, and the dummy bits DUM0 to DUM31 may correspond to the dummy data.

Figure 10:
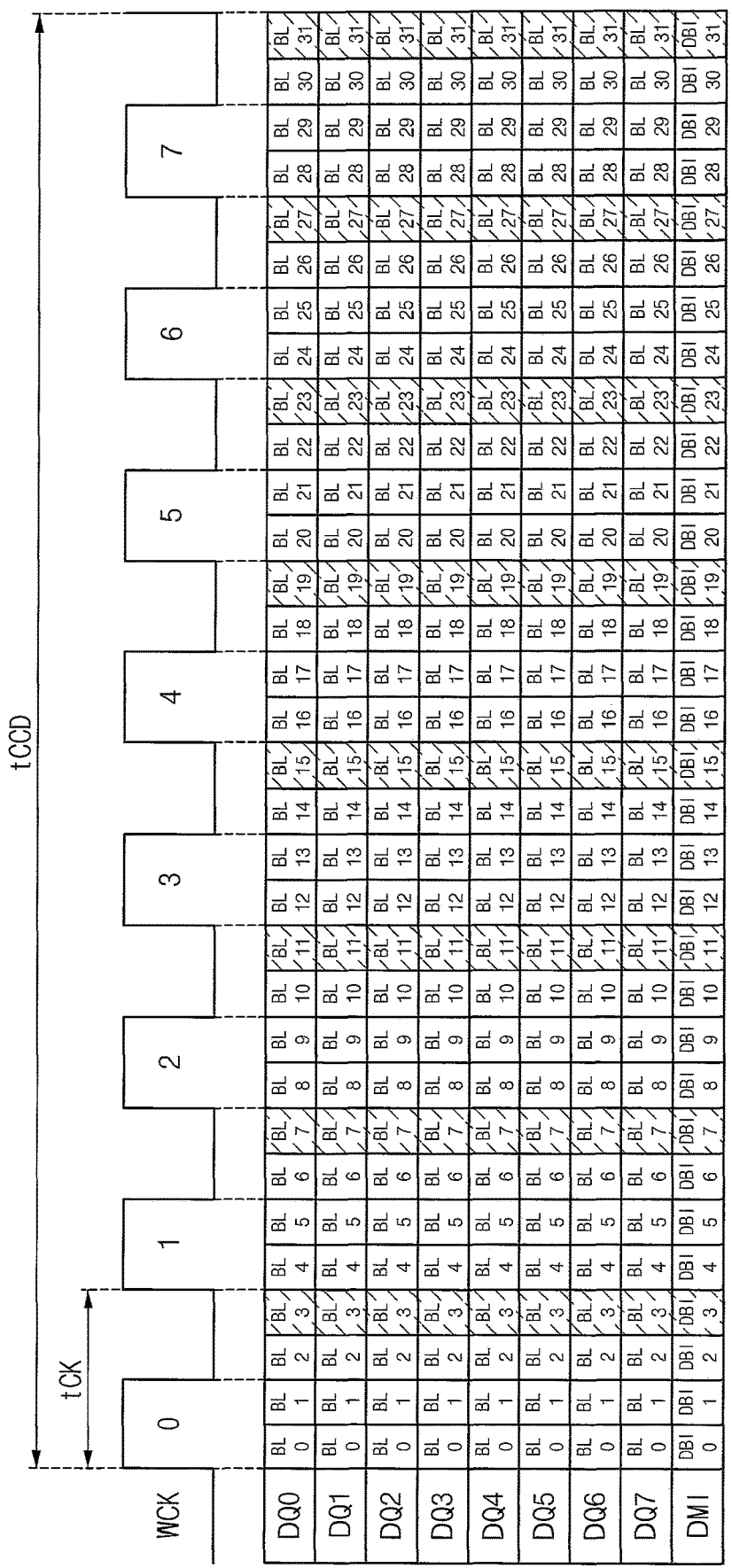
Figure 11:
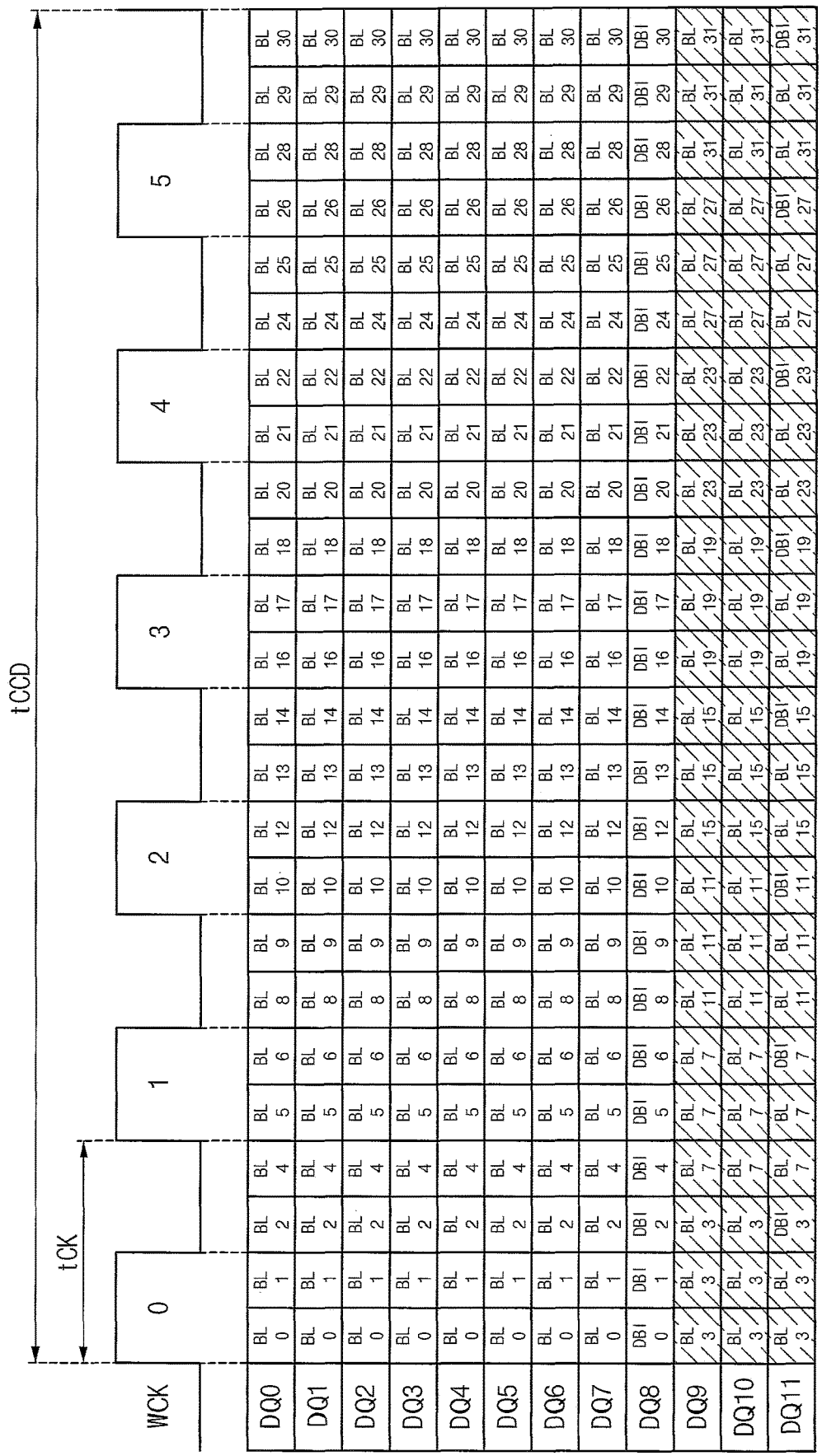

FIG. 10 illustrates a conventional example where both the burst length and the number of data I/O pins are implemented to correspond to an integer that is a power-of-two. FIG. 11 illustrates an example where both the burst length and the number of data I/O pins are implemented to correspond to an integer that is not a power-of-two according to example embodiments.

The example of FIG. 10 may be substantially the same as the example of FIG. 7. The example of FIG. 11 may be substantially the same as the example of FIG. 8, except that an arrangement of some bits is changed. The descriptions repeated with FIGS. 7 and 8 will be omitted.

In the example of FIG. 11, the data bits BL3, BL7, BL11, BL15, BL19, BL23, BL27 and BL31 and the DBI bits DBI3, DBI7, DBI11, DBI15, DBI19, DBI23, DBI27 and DBI31 may be arranged, allocated, and/or mapped to correspond to the data I/O pins DQ9, DQ10 and DQ11, as compared with the example of FIG. 10. In FIGS. 10 and 11, the data bits BL3, BL7, BL11, BL15, BL19, BL23, BL27 and BL31 and the DBI bits DBI3, DBI7, DBI11, DBI15, DBI19, DBI23, DBI27 and DBI31 whose arrangement, allocation and/or mapping are changed are hatched. In other embodiments, these hatched bits may be arranged, allocated, and/or mapped to correspond to three different data I/O pins (i.e., not data I/O pins DQ9, DQ10 and DQ11).

However, example embodiments are not limited thereto, and bits whose arrangement, allocation and/or mapping are changed may be variously determined according to example embodiments.

Figure 12:
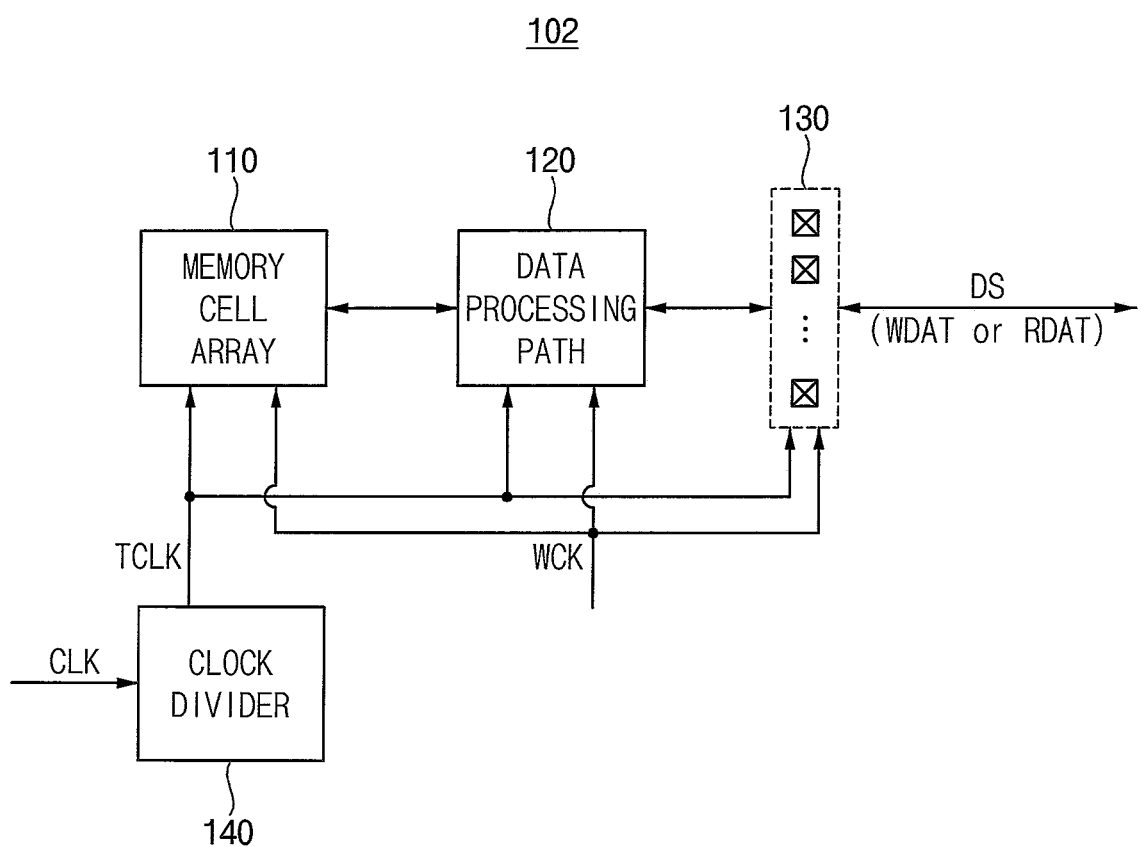
FIG. 12 is a block diagram illustrating a semiconductor memory device according to example embodiments.

FIG. 12 is a block diagram illustrating a semiconductor memory device according to example embodiments.

Referring to FIG. 12, a semiconductor memory device 102 includes a memory cell array 110, a data processing path 120 and a plurality of data I/O pins 130. The semiconductor memory device 102 may further include a clock divider 140.

The semiconductor memory device 102 may be substantially the same as the semiconductor memory device 100 of FIG. 1, except that the semiconductor memory device 102 further includes the clock divider 140. The descriptions repeated with FIG. 1 will be omitted.

The clock divider 140 may generate a second command clock signal TCLK based on a first command clock signal CLK. For example, the second command clock signal TCLK may be generated by dividing the first command clock signal CLK.

The memory cell array 110, the data processing path 120 and the plurality of data I/O pins 130 may operate based on the data clock signal WCK and the second command clock signal TCLK.

In some example embodiments, a division ratio of the clock divider 140, e.g., a value obtained by dividing a period of the second command clock signal TCLK by a period of the first command clock signal CLK may correspond to an integer that is not a power-of-two. For example, the division ratio of the clock divider 140 may correspond to an integer that is a multiple-of-three. However, example embodiments are not limited thereto, and the division ratio of the clock divider 140 may correspond to an arbitrary integer.

Figure 13:
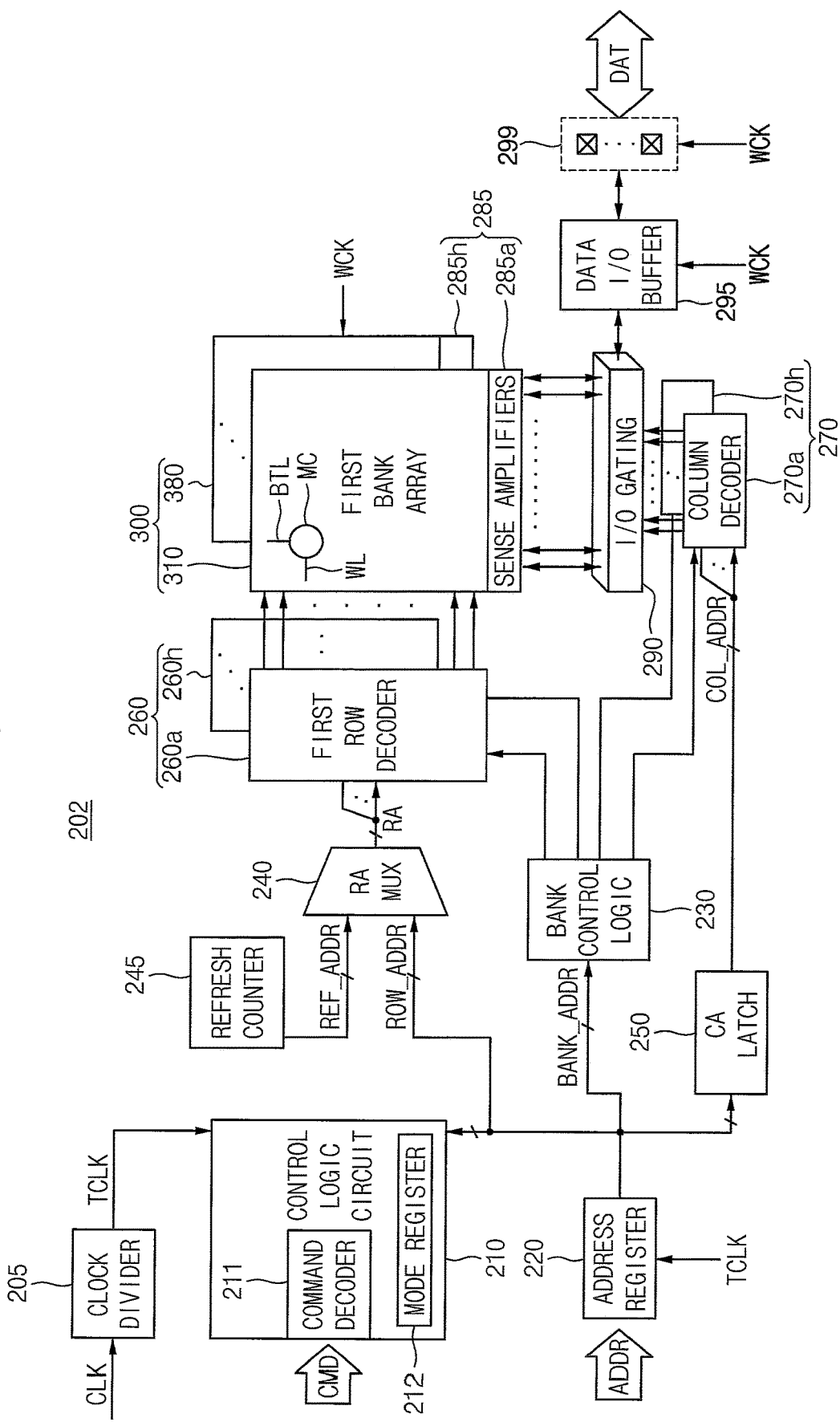
FIG. 13 is a block diagram illustrating an example of a semiconductor memory device of FIG. 12.

FIG. 13 is a block diagram illustrating an example of a semiconductor memory device of FIG. 12.

Referring to FIG. 13, a semiconductor memory device 202 may include a control logic circuit 210, an address register 220, a bank control logic circuit 230, a row address multiplexer 240, a refresh counter 245, a column address latch 250, a row decoder 260, a column decoder 270, a memory cell array 300, a sense amplifier unit 285, an I/O gating circuit 290, a data I/O buffer 295 and/or data I/O pins 299. The semiconductor memory device 202 may further include a clock divider 205.

The semiconductor memory device 202 may be substantially the same as the semiconductor memory device 200 of FIG. 4, except that the semiconductor memory device 202 further includes the clock divider 205. The descriptions repeated with FIG. 4 will be omitted.

The clock divider 205 may correspond to the clock divider 140 in FIG. 12. The clock divider 205 may generate the second command clock signal TCLK based on the first command clock signal CLK. The control logic circuit 210 and the address register 220 may operate based on the second command clock signal TCLK. For example, the first command clock signal CLK may be received from the memory controller or may be internally generated in the semiconductor memory device 202.

FIGS. 14, 15A, 15B, 16A and 16B are diagrams for describing an operation of a semiconductor memory device according to example embodiments.

Figure 14:
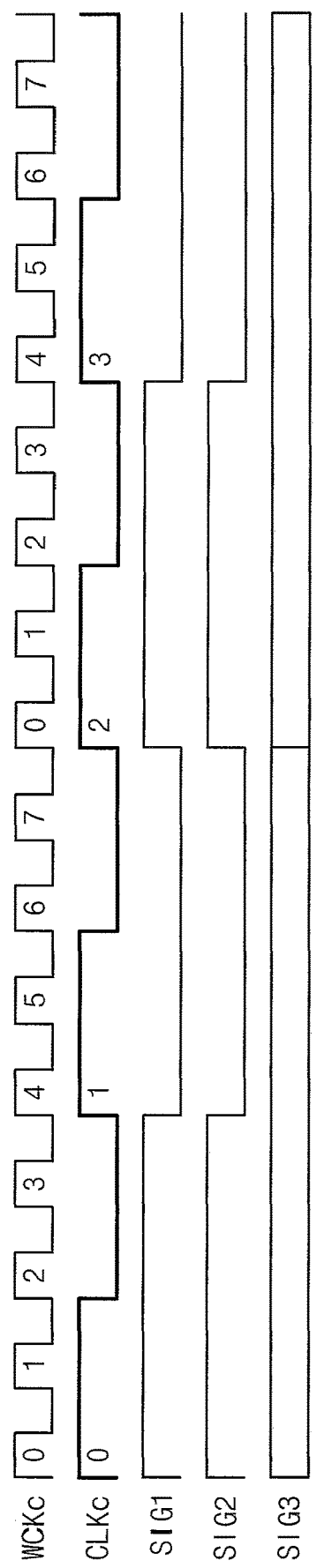
FIGS. 14, 15A, 15B, 16A and 16B are diagrams for describing an operation of a semiconductor memory device according to example embodiments.

Referring to FIG. 14, an example of the data clock signal WCKc, the command clock signal CLKc, and internal signals SIG1, SIG2 and SIG3 generated based thereon are illustrated. For example, the signals in FIG. 14 may be used in the conventional example where the burst length, the number of data I/O pins and the single data set are implemented as illustrated in FIG. 6.

Figure 15A:
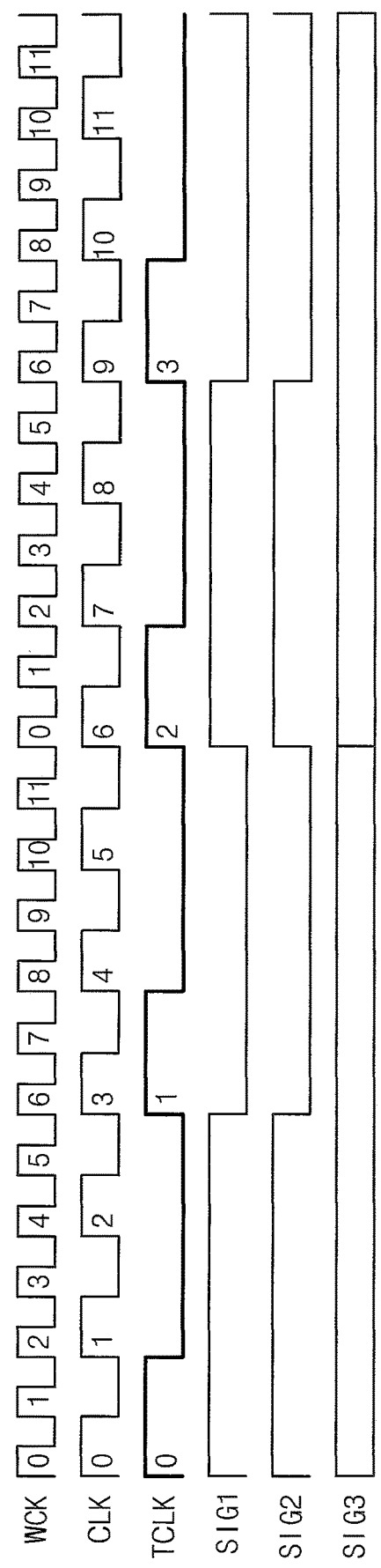

Referring to FIG. 15A, an example of the data clock signal WCK, the first command clock signal CLK, the second command clock signal TCLK, and internal signals SIG1, SIG2 and SIG3 generated based thereon are illustrated. For example, the signals in FIG. 15A may be used in the example where the burst length, the number of data I/O pins and the single data set are implemented according to example embodiments as illustrated in FIG. 8. For example, the value obtained by dividing the period of the second command clock signal TCLK by the period of the first command clock signal CLK, e.g., the division ratio of the clock divider 140 may be three. In other words, the clock divider 140 may be a 3:1 clock divider.

Figure 15B:
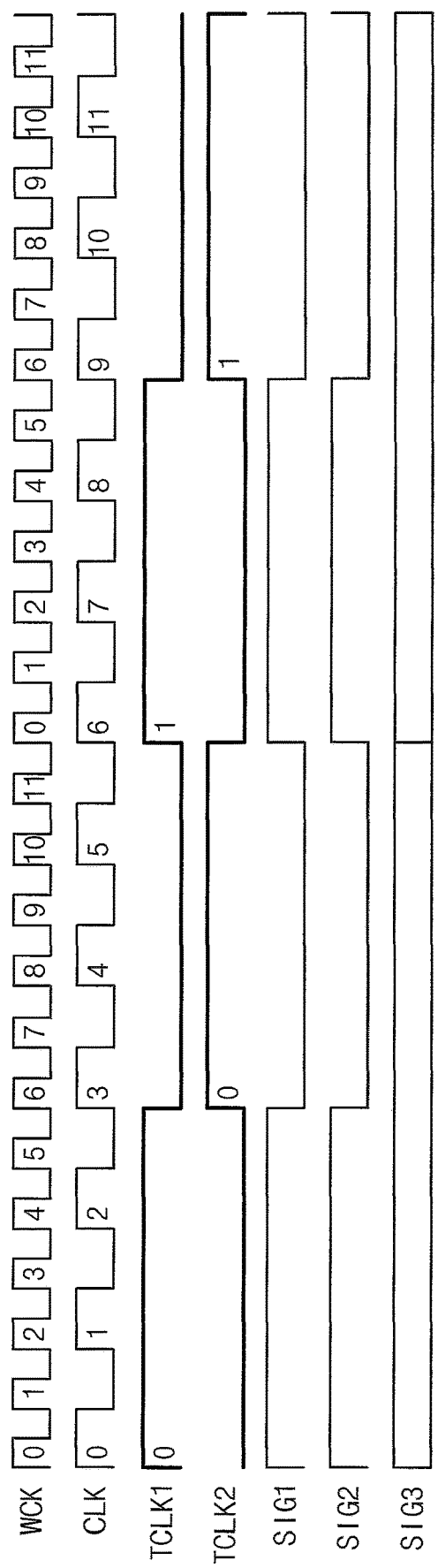

Referring to FIG. 15B, an example of the data clock signal WCK, the first command clock signal CLK, second command clock signals TCLK1 and TCLK2, and internal signals SIG1, SIG2 and SIG3 generated based thereon are illustrated. For example, the signals in FIG. 15B may be used in the example where the burst length, the number of data I/O pins and the single data set are implemented according to example embodiments as illustrated in FIG. 8. For example, the value obtained by dividing the period of the second command clock signals TCLK1 and TCLK2 by the period of the first command clock signal CLK, e.g., the division ratio of the clock divider 140 may be six.

The internal signals SIG1 to SIG3 in FIGS. 15A and 15B may be substantially the same as the internal signals SIG1 to SIG3 in FIG. 14. In other words, although the conventional example of FIG. 14 and example embodiments of FIGS. 15A and 15B operate based on the data clock signals WCKc and WCK having different periods and the command clock signals CLKc, TCLK, TCLK1 and TCLK2 having different periods, the same internal signals SIG1, SIG2, and SIG3 may be generated by the conventional example of FIG. 14 and example embodiments of FIGS. 15A and 15B. Therefore, both the conventional example of FIG. 14 and example embodiments of FIGS. 15A and 15B may be implemented using the same internal circuits (e.g., circuits included in the data processing path). In addition, the examples may be easily implemented even when performing a combo-operation, if necessary.

In some example embodiments, a value obtained by dividing the period of the second command clock signals TCLK, TCLK1 and TCLK2 by the period of the data clock signal WCK may correspond to an integer that is not a power-of-two. For example, a value obtained by dividing the period of the second command clock signal TCLK by the period of the data clock signal WCK may correspond to an integer that is a multiple-of-three (e.g., 6). For example, a value obtained by dividing the period of the second command clock signals TCLK1 and TCLK2 by the period of the data clock signal WCK may correspond to an integer that is a multiple-of-three (e.g., 12).

In some example embodiments, a value obtained by dividing the period of the first command clock signal CLK by the period of the data clock signal WCK may correspond to an integer that is a power-of-two (e.g., 2).

Figure 16A:
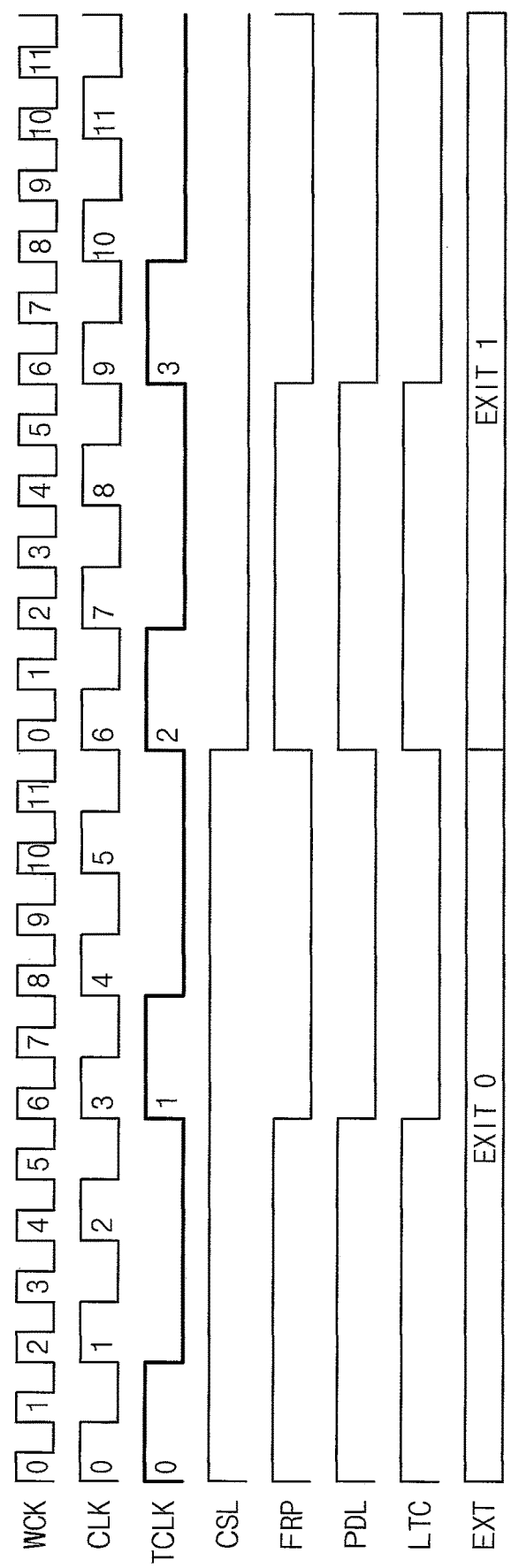

Referring to FIG. 16A, an example where a data read operation is performed using the signals in FIG. 15A is illustrated. In the data read operation, internal signals CSL, FRP, PDL, LTC and EXT as shown may be generated.

Figure 16B:
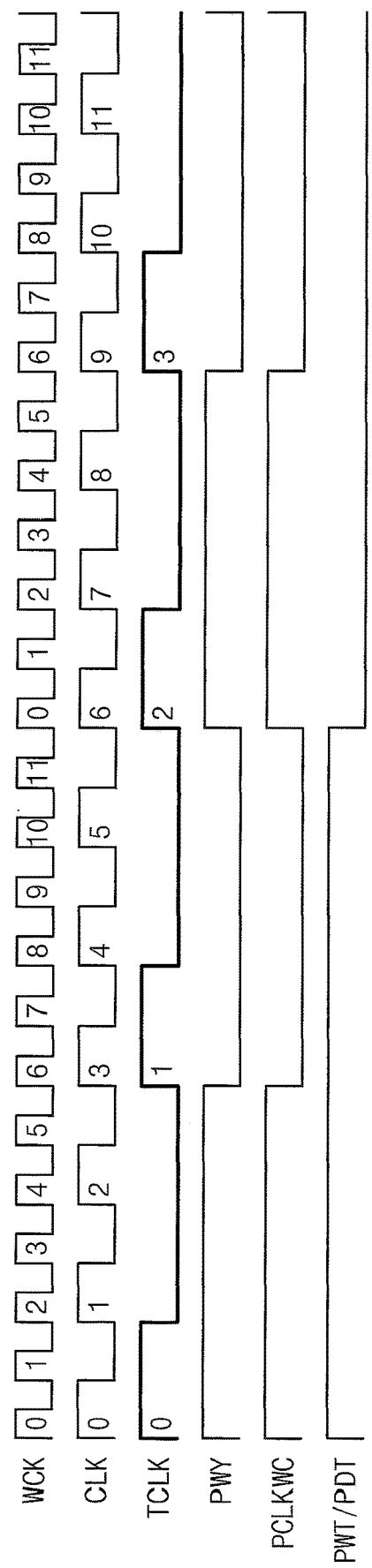

Referring to FIG. 16B, an example where a data write operation is performed using the signals in FIG. 15A is illustrated. In the data write operation, internal signals PWY, PCLKWC and PWT/PDT as shown may be generated.

Figure 17:
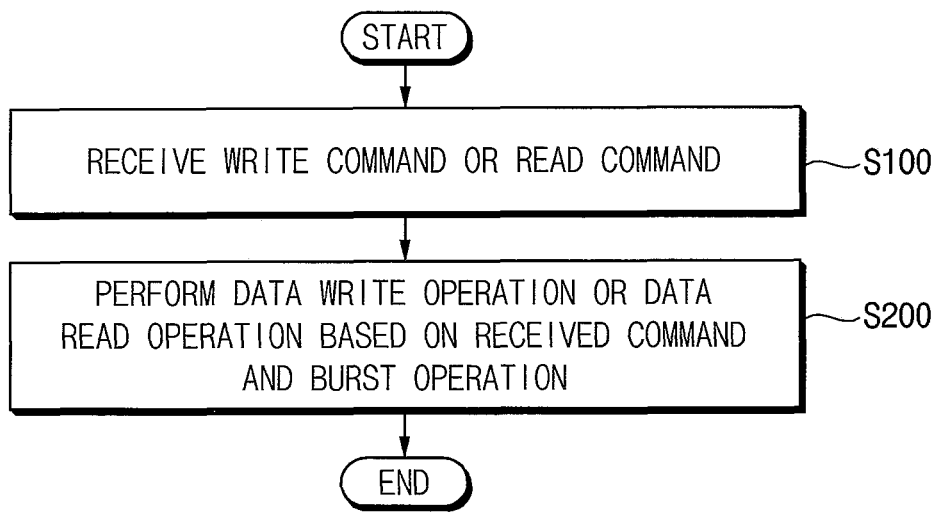
FIGS. 17 and 18 are flowcharts illustrating a method of operating a semiconductor memory device according to example embodiments.
Figure 18:
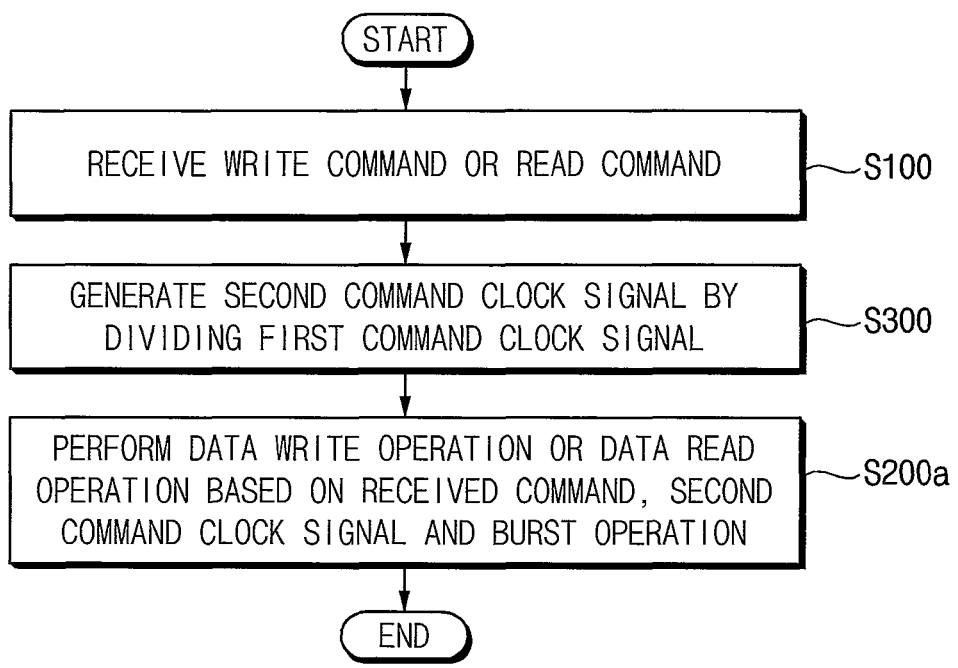

FIGS. 17 and 18 are flowcharts illustrating a method of operating a semiconductor memory device according to example embodiments.

Referring to FIGS. 1 and 17, a method of operating a semiconductor memory device according to example embodiments is performed by the semiconductor memory device 100 that includes the memory cell array 110 and the plurality of data I/O pins 130.

In the method of operating the semiconductor memory device according to example embodiments, the write command or the read command is received (step S100). Based on the write command or the read command, the data write operation in which the write data WDAT is stored in the memory cell array 110 or the data read operation in which the read data RDAT stored in the memory cell array 110 is retrieved from the memory cell array 110 is performed (step S200).

During the data write operation, the write data WDAT may be received through the plurality of data I/O pins 130. During the data read operation, the read data RDAT may be output through the plurality of data I/O pins 130. The operation of receiving the write data WDAT and the operation of outputting the read data RDAT may be performed based on the burst operation in which the single data set DS including the plurality of data bits is input or output through the plurality of data I/O pins 130 based on the single command received from the outside.

The number of the plurality of data I/O pins 130 may correspond to an integer that is not a power-of-two, and the burst length representing a unit of the burst operation may correspond to an integer that is not a power-of-two. For example, as described with reference to FIG. 2, at least one of the number of data I/O pins DQ0 to DQm and the burst length BL may correspond to an integer that is a multiple-of-three.

Referring to FIGS. 12 and 18, a method of operating a semiconductor memory device according to example embodiments is performed by the semiconductor memory device 102 that includes the memory cell array 110, the plurality of data I/O pins 130 and the clock divider 140.

In the method of operating the semiconductor memory device according to example embodiments, step S100 may be substantially the same as step S100 in FIG. 17. The second command clock signal TCLK may be generated by dividing the first command clock signal CLK (step S300). For example, the value obtained by dividing the period of the second command clock signal TCLK by the period of the first command clock signal CLK may correspond to an integer that is not a power-of-two. For example, the value obtained by dividing the period of the second command clock signal TCLK by the period of the first command clock signal CLK may correspond to an integer that is a multiple-of-three.

Based on the write command or the read command, the data write operation in which the write data WDAT is stored in the memory cell array 110 or the data read operation in which the read data RDAT stored in the memory cell array 110 is retrieved from the memory cell array 110 is performed (step S200a). Step S200a may be similar to step S200 in FIG. 17, except that the operation of receiving the write data WDAT and the operation of outputting the read data RDAT may be performed further based on the second command clock signal TCLK.

As will be appreciated by those skilled in the art, the inventive concept may be embodied as a system, method, computer program product, and/or a computer program product embodied in one or more computer readable medium(s) having computer readable program code embodied thereon. The computer readable program code may be provided to a processor of a general purpose computer, special purpose computer, or other programmable data processing apparatus. The computer readable medium may be a computer readable signal medium or a computer readable storage medium. The computer readable storage medium may be any tangible medium that can contain or store a program for use by or in connection with an instruction execution system, apparatus, or device. For example, the computer readable medium may be a non-transitory computer readable medium.

Figure 19:
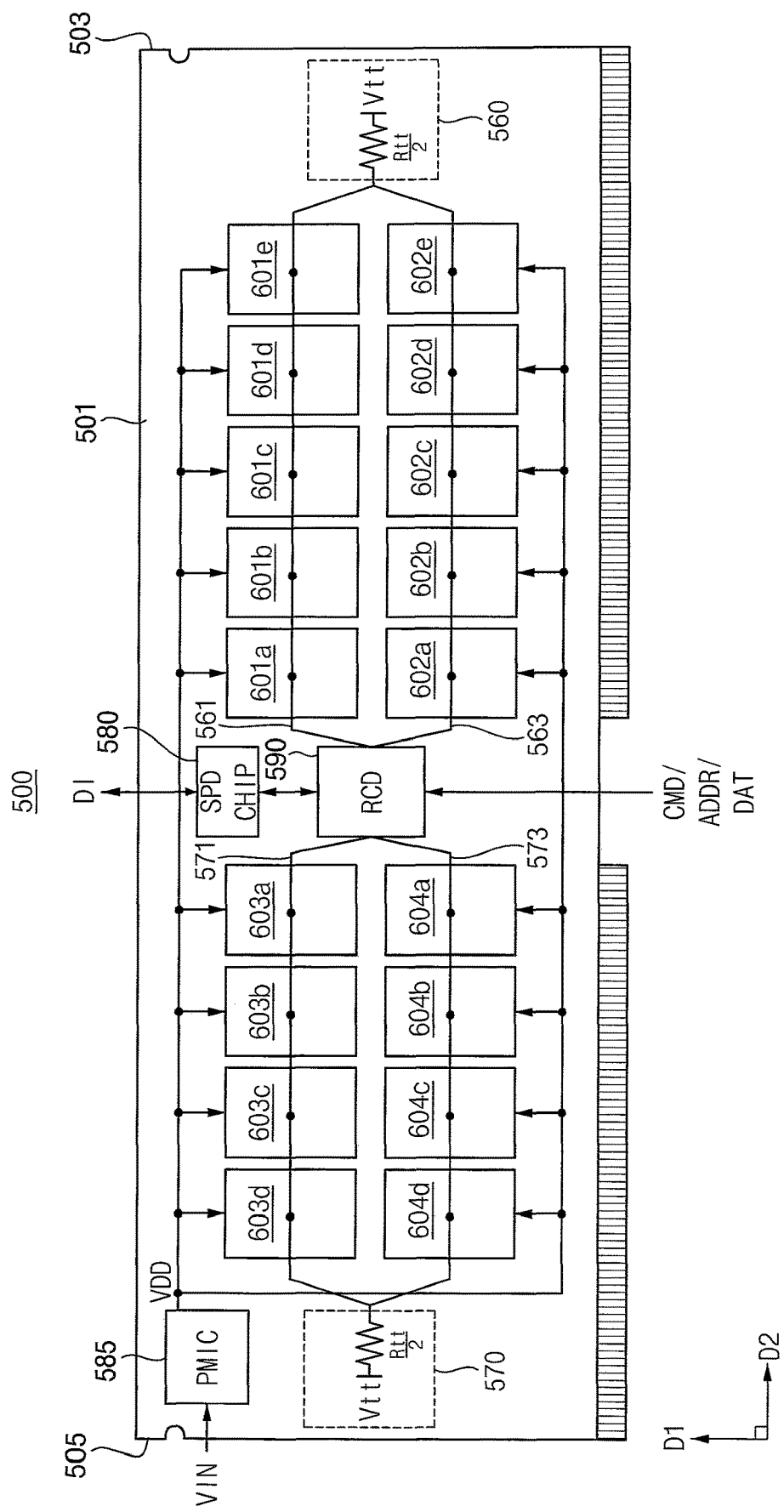
FIG. 19 is a block diagram illustrating an example of a memory module that may be employed in a memory system according to example embodiments.

FIG. 19 is a block diagram illustrating an example of a memory module that may be employed to a memory system according to example embodiments.

Referring to FIG. 19, a memory module 500 may include a buffer chip 590 (e.g., a registered clock driver (RCD)) disposed in or mounted on a circuit board 501, a plurality of semiconductor memory devices 601a, 601b, 601c, 601d, 601e, 602a, 602b, 602c, 602d, 602e, 603a, 603b, 603c, 603d, 604a, 604b, 604c and 604d, module resistance units 560 and 570, a serial present detection (SPD) chip 580, and/or a power management integrated circuit (PMIC) 585.

The buffer chip 590 may control the semiconductor memory devices 601a to 601e, 602a to 602e, 603a to 603d and 604a to 604d, and the PMIC 585, under a control of a memory controller (e.g., the memory controller 20 in FIG. 3). For example, the buffer chip 590 may receive the address ADDR, the command CMD, and the data DAT from the memory controller.

The SPD chip 580 may be a programmable read only memory (PROM) (e.g., an electrically erasable PROM (EEPROM)). The SPD chip 580 may include initial information and/or device information DI of the memory module 500. In some example embodiments, the SPD chip 580 may include the initial information and/or the device information DI such as a module form, a module configuration, a storage capacity, a module type, an execution environment, and/or the like of the memory module 500.

When a memory system including the memory module 500 is booted up, the memory controller may read the device information DI from the SPD chip 580, and may recognize the memory module 500 based on the device information DI. The memory controller may control the memory module 500 based on the device information DI from the SPD chip 580. For example, the memory controller may recognize a type of the semiconductor memory devices included in the memory module 500 based on the device information DI from the SPD chip 580.

Here, the circuit board 501 which is a printed circuit board (PCB) may extend in a second direction D2, perpendicular to a first direction D1, between a first edge portion 503 and a second edge portion 505. The first edge portion 503 and the second edge portion 505 may extend in the first direction D1. The buffer chip 590 may be on a center of the circuit board 501. The plurality of memory devices 601a to 601e, 602a to 602e, 603a to 603d and 604a to 604d may be arranged in a plurality of rows between the buffer chip 590 and the first edge portion 503, and between the buffer chip 590 and the second edge portion 505. In some example embodiments, operations described herein as being performed by the buffer chip 590 may be performed by processing circuitry.

In this example, the semiconductor memory devices 601a to 601e and 602a to 602e may be arranged along a plurality of rows between the buffer chip 590 and the first edge portion 503. The semiconductor memory devices 603a to 603d and 604a to 604d may be arranged along a plurality of rows between the buffer chip 590 and the second edge portion 505. The semiconductor memory devices 601a to 601d, 602a to 602d, 603a to 603d and 604a to 604d may be referred to as data chips storing the actual data, and the semiconductor memory devices 601e and 602e may be referred to as parity chips storing the ECC information (e.g., parity bits)

The buffer chip 590 may provide a command/address signal (e.g., CA) to the semiconductor memory devices 601a to 601e through a command/address transmission line 561, and may provide a command/address signal to the semiconductor memory devices 602a to 602e through a command/address transmission line 563. In addition, the buffer chip 590 may provide a command/address signal to the semiconductor memory devices 603a to 603d through a command/address transmission line 571, and may provide a command/address signal to the semiconductor memory devices 604a to 604d through a command/address transmission line 573.

The command/address transmission lines 561 and 563 may be connected in common to the module resistance unit 560 disposed to be adjacent to the first edge portion 503, and the command/address transmission lines 571 and 573 may be connected in common to the module resistance unit 570 disposed to be adjacent to the second edge portion 505. Each of the module resistance units 560 and 570 may include a termination resistor Rtt/2 connected to a termination voltage Vtt.

For example, each of or at least one of the plurality of semiconductor memory devices 601a to 601e, 602a to 602e, 603a to 603d, and 604a to 604d may be or include a DRAM device.

The SPD chip 580 may be adjacent to the buffer chip 590, and the PMIC 585 may be between the semiconductor memory device 603d and the second edge portion 505. The PMIC 585 may generate a power supply voltage VDD based on an input voltage VIN, and may provide the power supply voltage VDD to the semiconductor memory devices 601a to 601e, 602a to 602e, 603a to 603d, and 604a to 604d.

Figure 20:
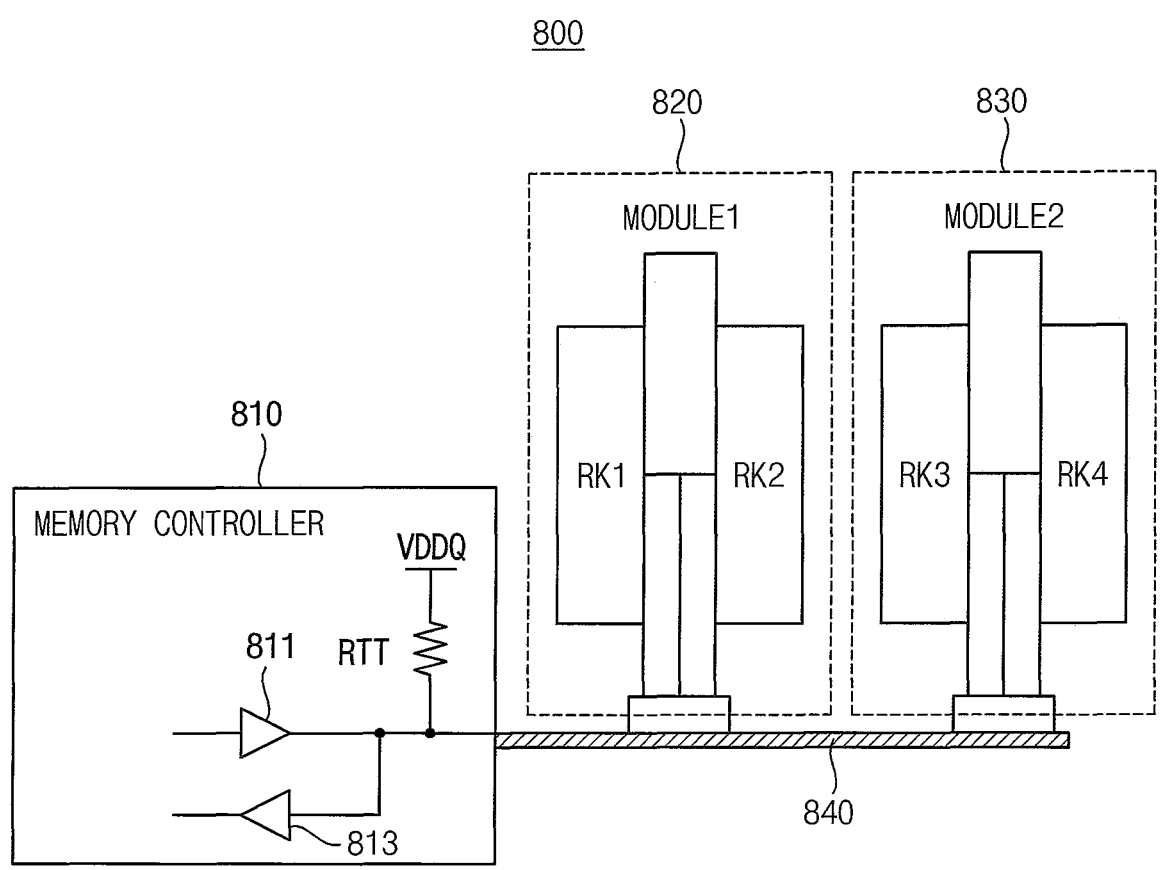
FIG. 20 is a block diagram illustrating an example of a memory system according to example embodiments.

FIG. 20 is a block diagram illustrating an example of a memory system according to example embodiments.

Referring to FIG. 20, a memory system 800 may include a memory controller 810 and/or memory modules 820 and 830. For example, the memory system 800 may have quad-rank memory modules. While two memory modules are depicted in FIG. 20, more or fewer memory modules may be included in the memory system 800, according to example embodiments.

The memory controller 810 may control the memory modules 820 and/or 830 so as to perform a command supplied from a processor and/or a host. The memory controller 810 may be implemented using processing circuitry (e.g., a processor) and/or may be implemented with a host, an application processor (AP) or a system-on-a-chip (SoC). For signal integrity, a source termination may be implemented with a resistor RTT on a bus 840 of the memory controller 810. The resistor RTT may be connected to a power supply voltage VDDQ. The memory controller 810 may include a transmitter 811 that may transmit a signal to at least one of the memory modules 820 and/or 830, and a receiver 813 that may receive a signal from at least one of the memory modules 820 and/or 830.

The memory modules 820 and 830 may be referred to as a first memory module 820 and a second memory module 830. The first memory module 820 and the second memory module 830 may be connected to the memory controller 810 through the bus 840. Each of the first memory module 820 and the second memory module 830 may correspond to the memory module 500 of FIG. 19. The first memory module 820 may include memory ranks RK1 and RK2, and the second memory module 830 may include memory ranks RK3 and RK4.

Figure 21:
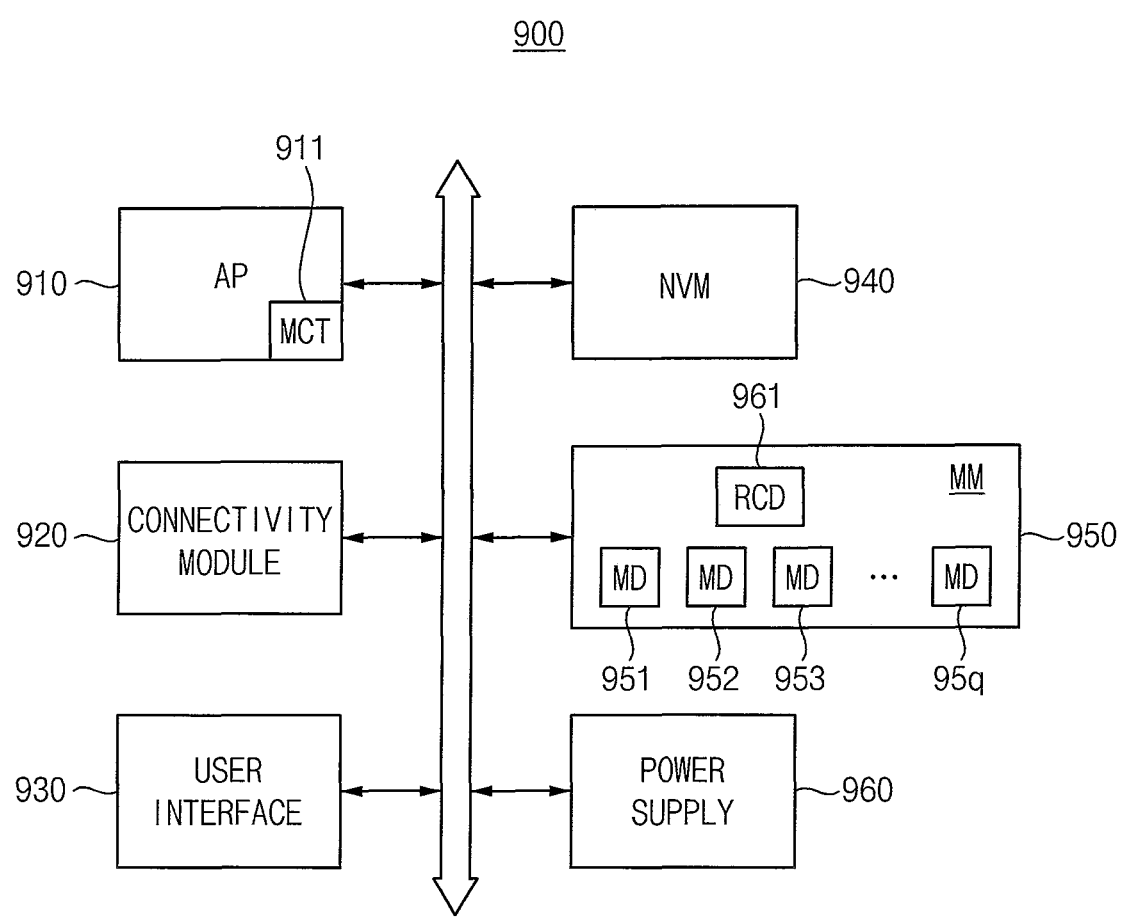
FIG. 21 is a block diagram illustrating an electronic system including a memory module according to example embodiments.

FIG. 21 is a block diagram illustrating an electronic system including a memory module according to example embodiments.

Referring to FIG. 21, an electronic system 900 may include an application processor (AP) 910, a connectivity module 920, a user interface 930, a nonvolatile memory (NVM) device 940, a memory module (MM) 950 such as a Dual In-line Memory Module (DIMM), and/or a power supply 960. For example, the electronic system 900 may be a mobile system.

The application processor 910 may include a memory controller 911. The application processor 910 may execute applications, such as at least one of a web browser, a game application, a video player, etc. The connectivity module 920 may perform wired and/or wireless communication with an external device.

The memory module 950 may store data processed by the application processor 910 and/or operate as a working memory. The memory module 950 may include a plurality of memory devices (MD) 951, 952, 953, . . . , 95q (where q is a positive integer greater than three), and/or a buffer chip (RCD) 961. The memory module 950 may be the memory module 500 of FIG. 19.

The nonvolatile memory device 940 may store a boot image for booting the electronic system 900. The user interface 930 may include at least one input device, such as a keypad, a touch screen, etc., and at least one output device, such as a speaker, a display device, etc. The power supply 960 may supply an operating voltage to the electronic system 900.

The electronic system 900 or components of the electronic system 900 may be mounted using various types of packages.

The inventive concept may be applied to various electronic devices and systems that include the semiconductor memory devices. For example, the inventive concept may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, an automotive, etc.

The foregoing is illustrative of example embodiments and is not to be construed as limiting thereof. Although some example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor memory device comprising:
    a memory cell array;
    a plurality of data input/output (I/O) pins configured to receive write data to be stored in the memory cell array or to output read data stored in the memory cell array; and
    a clock divider configured to generate a second command clock signal based on a first command clock signal,
    wherein:
        the semiconductor memory device is configured to perform a burst operation in which a single data set comprising a plurality of data bits is input or output through the plurality of data I/O pins based on a single command received from an external memory controller,
        a number of the plurality of data I/O pins corresponds to an integer that is not a power-of-two,
        a burst length representing a unit of the burst operation corresponds to an integer that is not a power-of-two,
        the memory cell array and the plurality of data I/O pins are configured to operate based on the second command clock signal and a data clock signal, and
        a period of the second command clock signal divided by a period of the data clock signal corresponds to an integer that is not a power-of-two.

2. The semiconductor memory device of claim 1, wherein:
    the single data set comprises the write data or the read data,
    the plurality of data bits in the single data set comprise first data bits corresponding to the write data or the read data, and
    a number of the first data bits corresponds to an integer that is a power-of-two.

3. The semiconductor memory device of claim 2, wherein:
    the single data set further comprises additional data associated with the write data or the read data, and
    the plurality of data bits in the single data set further comprises second data bits other than the first data bits, the second data bits corresponding to the additional data.

4. The semiconductor memory device of claim 3, wherein a number of the second data bits corresponds to an integer that is a power-of-two.

5. The semiconductor memory device of claim 3, wherein a number of the plurality of data bits including the first data bits and the second data bits corresponds to an integer that is not a power-of-two.

6. The semiconductor memory device of claim 3, wherein the additional data comprises at least one of data bus inversion (DBI) information, error correction code (ECC) information, and meta data.

7. The semiconductor memory device of claim 2, wherein:

the single data set further comprises dummy data not relevant to the write data or the read data, and the plurality of data bits in the single data set further comprises second data bits other than the first data bits, the second data bits corresponding to the dummy data.

8. The semiconductor memory device of claim 1, wherein the burst length corresponds to an integer that is a multiple-of-three.

9. The semiconductor memory device of claim 1, wherein a division ratio of the clock divider corresponds to an integer that is not a power-of-two.

10. The semiconductor memory device of claim 9, wherein the division ratio of the clock divider corresponds to an integer that is a multiple-of-three.

11. The semiconductor memory device of claim 1, wherein the period of the second command clock signal divided by the period of the data clock signal corresponds to an integer that is a multiple-of-three.

12. The semiconductor memory device of claim 1, further comprising:
   a data processing path between the memory cell array and the plurality of data I/O pins, and
   wherein the data processing path is configured to operate based on the second command clock signal and the data clock signal.

13. The semiconductor memory device of claim 1, wherein the burst length is twenty-four (24), the number of the plurality of data I/O pins is twelve (12), and a number of the plurality of data bits in the single data set is two hundred eighty-eight (288).

14. A method of operating a semiconductor memory device, the method comprising:
   receiving a write command or a read command;
   generating a second command clock signal by dividing a first command clock signal; and
   performing, based on the second command clock signal and a data clock signal, at least one of: a data write operation in which write data is stored in a memory cell array; or a data read operation in which read data stored in the memory cell array is retrieved from the memory cell array, wherein the performing is based on the write command or the read command,
   wherein:
   during the data write operation, the write data is received through a plurality of data input/output (I/O) pins,
   during the data read operation, the read data is output through the plurality of data I/O pins,
   an operation of receiving the write data and/or an operation of outputting the read data is performed based on a burst operation in which a single data set comprising a plurality of data bits is input or output through the plurality of data I/O pins based on a single command received from an external memory controller,
   a number of the plurality of data I/O pins corresponds to an integer that is not a power-of-two,
   a burst length representing a unit of the burst operation corresponds to an integer that is not a power-of-two, and
   a period of the second command clock signal divided by a period of the data clock signal corresponds to an integer that is not a power-of-two.

15. The method of claim 14,
   wherein the operation of receiving the write data and/or the operation of outputting the read data is performed based on the second command clock signal.

16. A semiconductor memory device comprising:
   a memory cell array;
   a plurality of data input/output (I/O) pins configured to receive write data to be stored in the memory cell array or to output read data stored in the memory cell array;
   a data processing path between the memory cell array and the plurality of data I/O pins; and
   a clock divider configured to generate a second command clock signal based on a first command clock signal,
   wherein:
   a data write operation in which write data is stored in the memory cell array is performed based on a write command, or a data read operation in which the read data stored in the memory cell array is retrieved from the memory cell array is performed based on a read command,
   an operation of receiving the write data and/or an operation of outputting the read data is performed based on a burst operation in which a single data set comprising a plurality of data bits is input or output through the plurality of data I/O pins based on a single command received from an external memory controller,
   a number of the plurality of data I/O pins corresponds to an integer that is not a power-of-two,
   a burst length representing a unit of the burst operation corresponds to an integer that is not a power-of-two and corresponds to an integer that is a multiple-of-three,
   the plurality of data bits in the single data set comprises first data bits corresponding to the write data or the read data,
   a number of the first data bits corresponds to an integer that is a power-of-two,
   the memory cell array, the data processing path, and the plurality of data I/O pins are configured to operate based on a data clock signal and the second command clock signal,
   a division ratio of the clock divider corresponds to an integer that is not a power-of-two and corresponds to an integer that is a multiple-of-three, and
   a value obtained by dividing a period of the second command clock signal by a period of the data clock signal corresponds to an integer that is not a power-of-two and corresponds to an integer that is a multiple-of-three.

17. The method of claim 14, wherein:
   the single data set comprises the write data or the read data,
   the plurality of data bits in the single data set comprise first data bits corresponding to the write data or the read data, and
   a number of the first data bits corresponds to an integer that is a power-of-two.

18. The method of claim 17, wherein:
   the single data set further comprises additional data associated with the write data or the read data, and
   the plurality of data bits in the single data set further comprises second data bits other than the first data bits, the second data bits corresponding to the additional data.

19. The method of claim 14, wherein the second command clock signal is generated by a clock divider, and wherein a division ratio of the clock divider corresponds to an integer that is not a power-of-two.

20. The method of claim 14, wherein the value obtained by dividing the period of the second command clock signal by the period of the data clock signal corresponds to an integer that is a multiple-of-three.

* * * * *